United States Patent
Yunker et al.

(10) Patent No.: US 6,776,623 B1
(45) Date of Patent: Aug. 17, 2004

(54) TRANSCEIVER MOUNTING ADAPTERS

(75) Inventors: Bryan Yunker, Longmont, CO (US); Andrew Moore, Broomfield, CO (US); Rob Pauley, Boulder, CO (US)

(73) Assignee: Picolight Incorporated, Boulder, CO (US)

(*) Notice: Subject to any disclaimer, the term of this patent is extended or adjusted under 35 U.S.C. 154(b) by 0 days.

(21) Appl. No.: 09/877,216

(22) Filed: Jun. 11, 2001

(51) Int. Cl.⁷ .............................................. H01R 12/00
(52) U.S. Cl. ......................................... 439/71; 439/66
(58) Field of Search ............................. 439/71, 66, 73, 439/74, 83, 68, 91

(56) References Cited

U.S. PATENT DOCUMENTS

| | | | | |
|---|---|---|---|---|
| 4,857,001 A | * | 8/1989 | Nakano et al. ................ | 439/68 |
| 5,702,255 A | * | 12/1997 | Murphy et al. ............... | 439/71 |
| 5,713,744 A | * | 2/1998 | Laub et al. | |
| 5,919,050 A | * | 7/1999 | Kehley et al. ................. | 439/71 |
| 5,997,317 A | * | 12/1999 | Pei et al. ....................... | 439/83 |
| 6,016,254 A | * | 1/2000 | Pfaff ........................... | 361/769 |
| 6,257,904 B1 | * | 7/2001 | Lin ............................... | 439/83 |
| 6,280,202 B1 | * | 8/2001 | Alden, 3rd et al. ........... | 439/66 |
| 6,344,684 B1 | * | 2/2002 | Hussain et al. ............. | 257/697 |
| 6,469,906 B1 | * | 10/2002 | Baltz et al. .................. | 361/760 |

* cited by examiner

Primary Examiner—Alexander Gilman
(74) Attorney, Agent, or Firm—Jagtiani + Guttag

(57) ABSTRACT

A transceiver adapter is provided that includes a substrate, including electrical contacts on a first side thereof for electrically contacting a transceiver, and electrical contacts on a second side thereof for electrically contacting a printed wire assembly. A transceiver adapter is also provided that includes an adapter plate, including (a) tabs for positioning a transceiver, and (b) mounting pins for coupling the adapter plate with a, printed wire assembly; and a substrate hole through which a transceiver may be electrically mated with a printed wire assembly. A transceiver is also provided that includes electrical contacts; and a mateable electrical connector, including (a) electrical contacts on a first side thereof for electrically contacting the electrical contacts of the transceiver, and (b) electrical contacts on a second side thereof for electrically contacting a printed wire assembly.

50 Claims, 20 Drawing Sheets

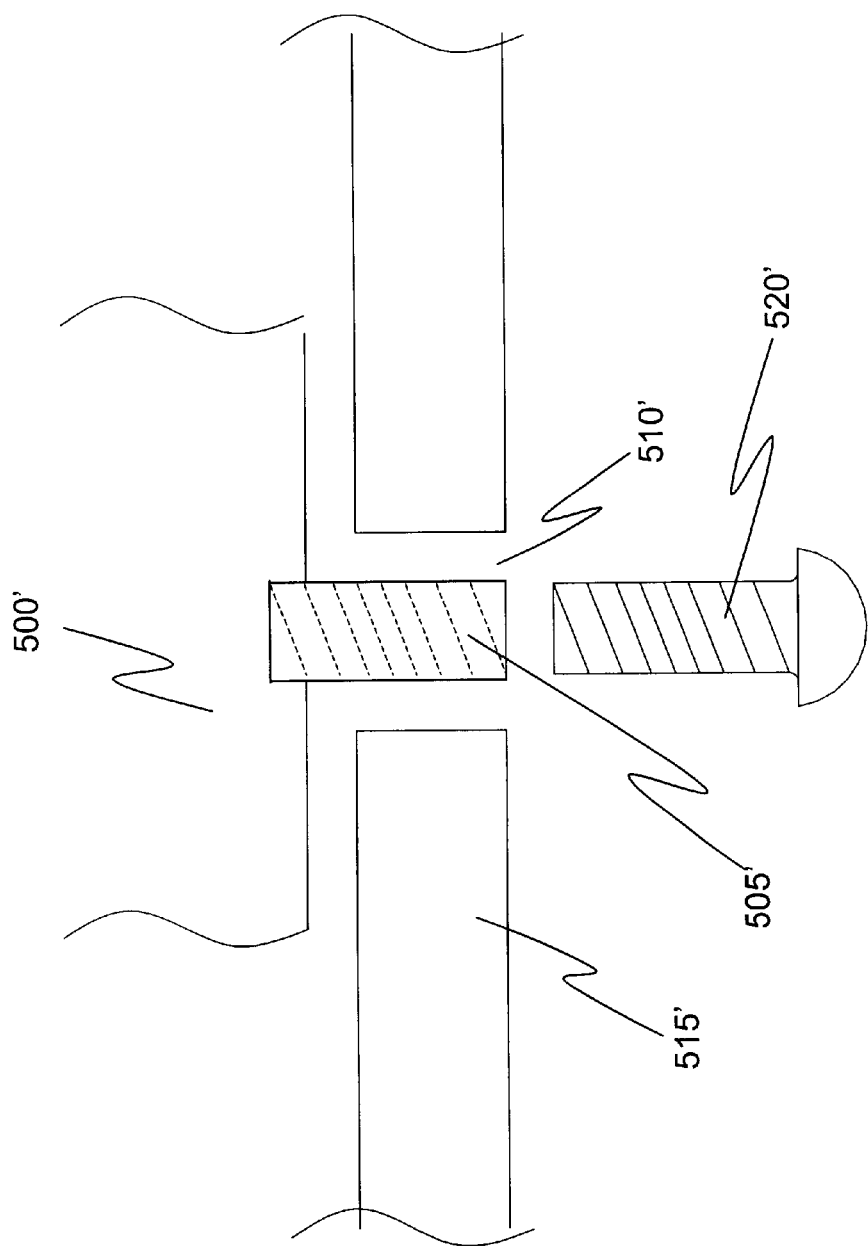

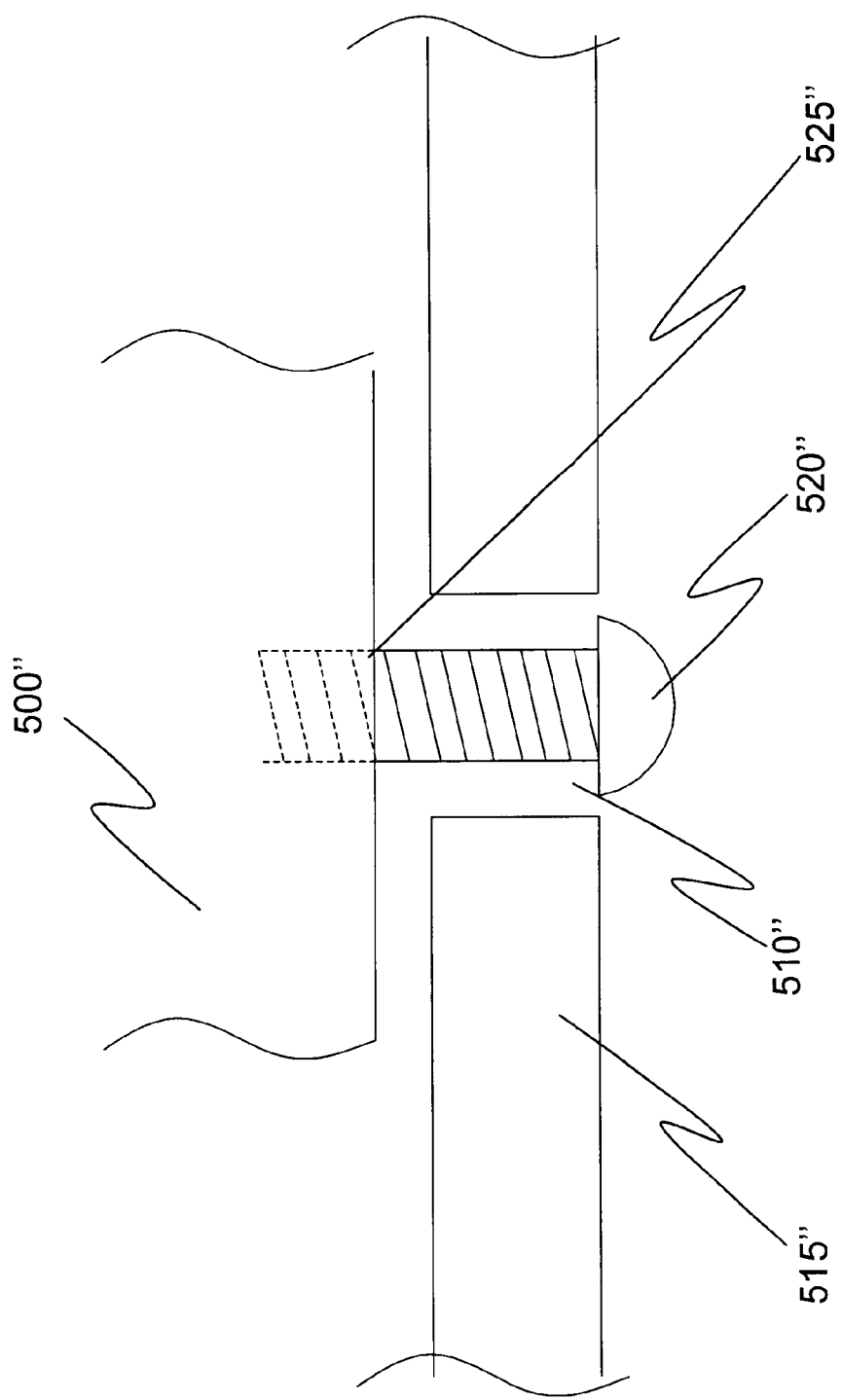

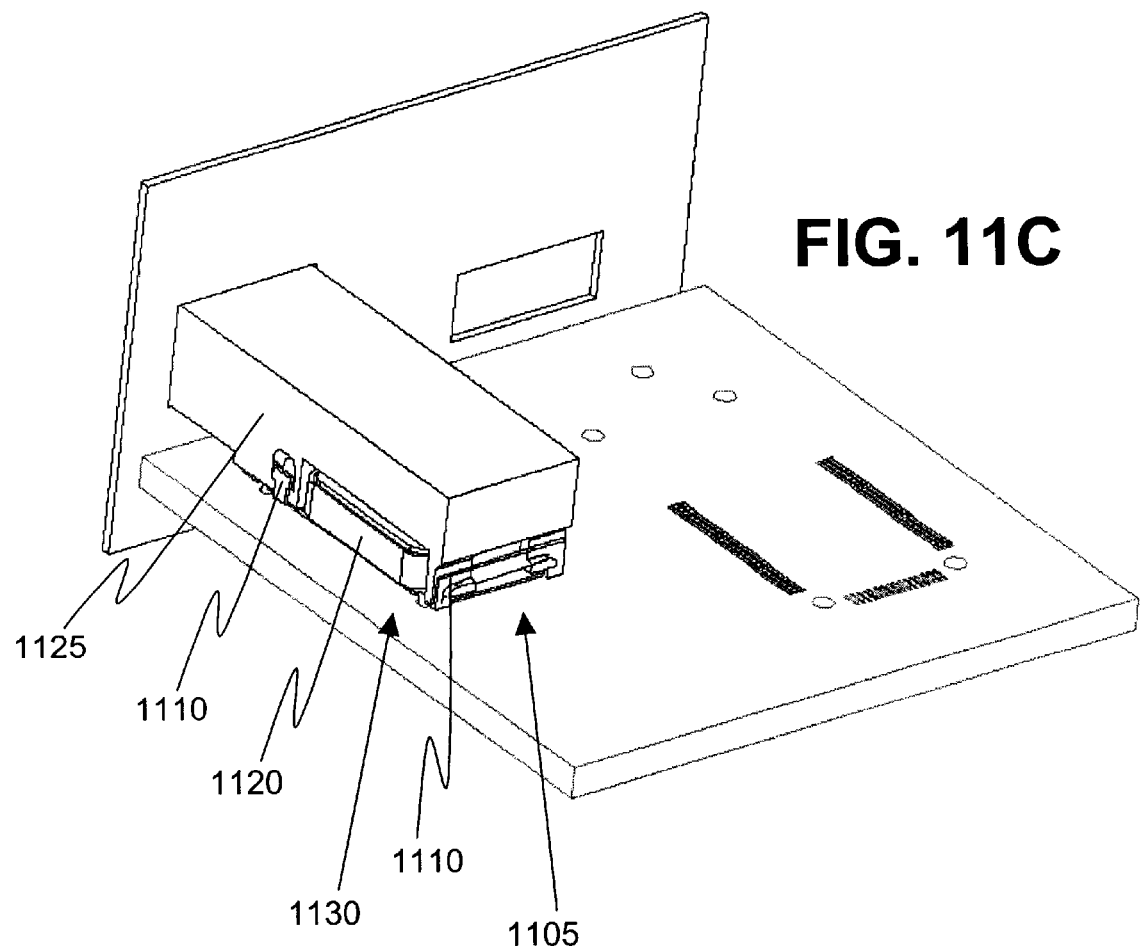

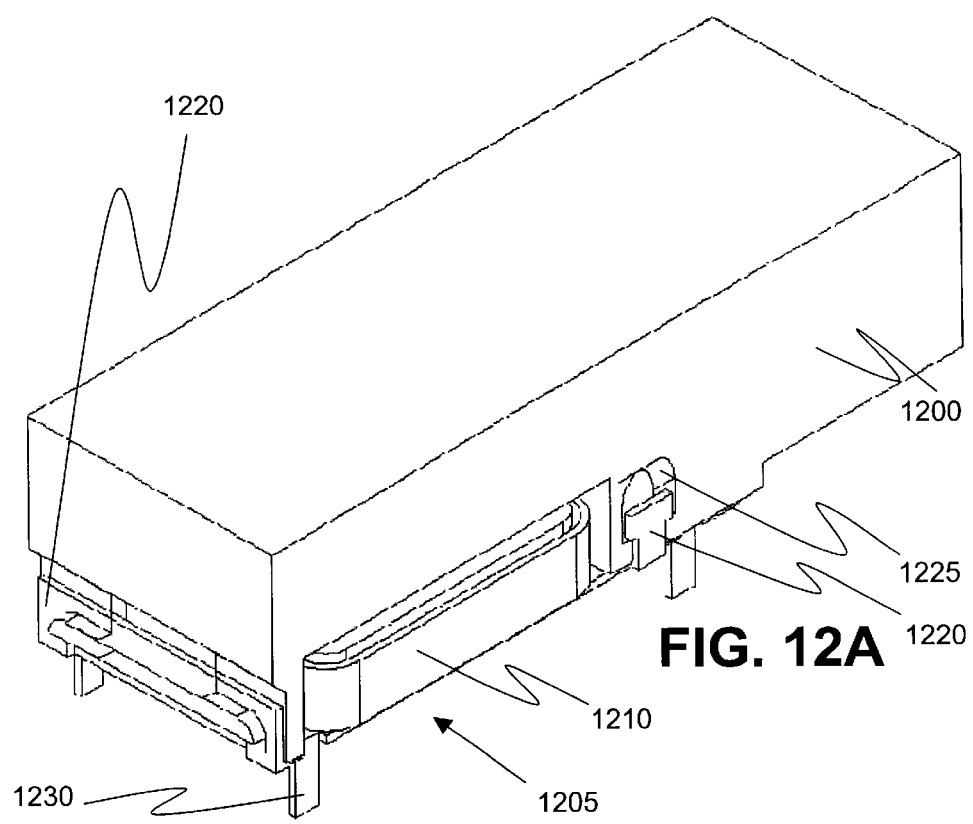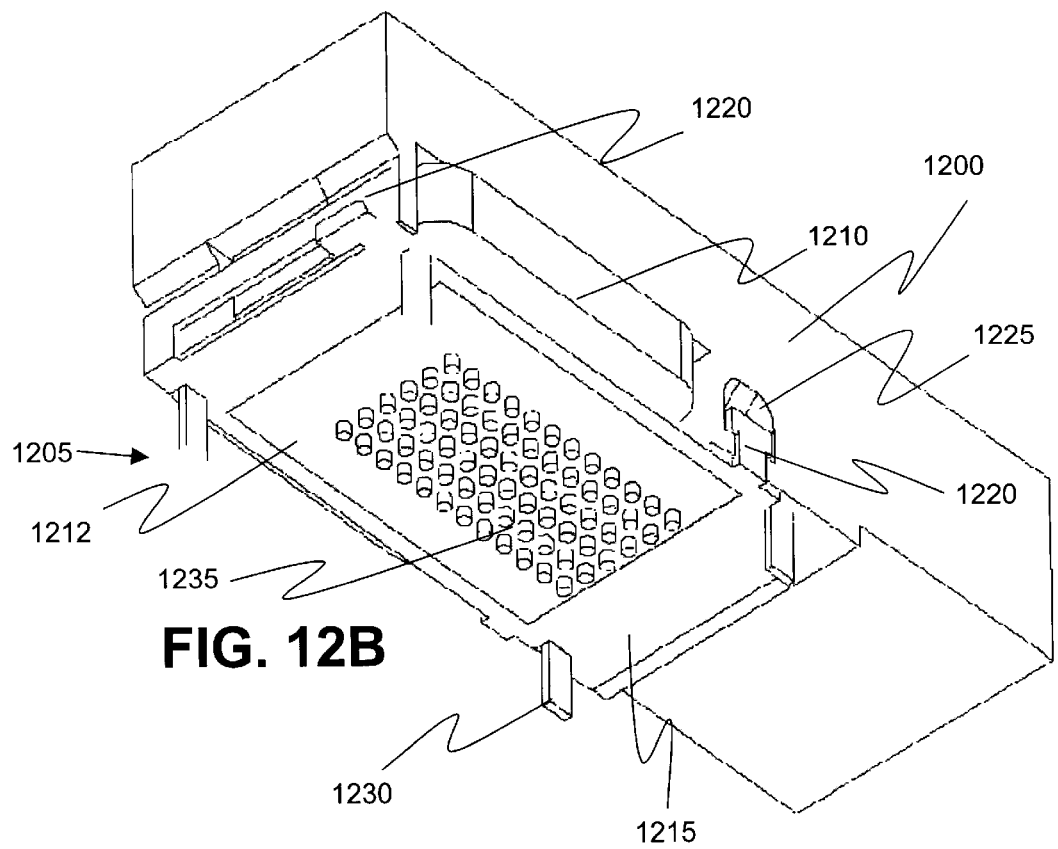

TRANSCEIVER MOUNTING ADAPTERS

CROSS-REFERENCE TO RELATED APPLICATIONS

This application makes reference to U.S. patent application Ser. No. 09/877,130, entitled "Mounted Transceivers," filed Jun. 11, 2001, the entire contents and disclosure of which is hereby incorporated by reference.

BACKGROUND OF THE INVENTION

1. Field of the Invention

The present invention relates generally to optical or copper media transceivers, and more particularly to adapters for mounting various transceivers on different printed wire boards.

2. Description of the Prior Art

Optical transmitters convert a low voltage differential electrical data signal distributed on an electrical medium such as a copper printed wiring assembly (PWA) or a connector to an optical signal propagating over an optical medium such as a glass, plastic fiber or free space. Optical receivers convert an optical signal propagating over an optical medium such as a glass, plastic fiber or free space to a low voltage differential electrical data signal distributed on an electrical medium such as a copper printed wiring assembly (PWA) or a connector. Optical transceivers combine optical transmitters and optical receivers in a single unit or module. In order to pass data at very high data rates, the optical transceiver utilizes high bandwidth amplifiers to ensure fast edge rates and open data eye patterns. To properly reproduce signals that have traveled over long cables and through multiple interconnects, optical transceiver amplifiers are configured with high gain and bandwidth as well as good signal to noise ratios. With inherently high bandwidth and sensitivity, optical transceivers can pass noise present in the host system into the data stream if the host PWA is not properly designed, resulting in poor error rates, intermittent problems and poor electromagnetic interference (EMI) compliance.

Optical transceivers differ in size and shape and in the manner in which they connect to a host PWA depending on the manufacturer of the optical transceiver. The mounting requirements of optical transceivers make optical transceiver manufacture and host PWA construction difficult and expensive. The ability to connect an optical transceiver to a host PWA that is not specifically manufactured to mate with the optical transceiver would increase the value of the optical transceiver and allow for efficient connection to multiple prefabricated host PWAs, and facilitate pre-shipment configuration and field upgrade requirements.

Currently, connecting a transceiver with a host PWA requires additional manual soldering operations. Manual soldering is expensive and greatly limits the ability of repairing or upgrading the host PWA in the field. In other situations, the optical sub-assembly (OSA), including the various electrical contacts and host PWA, are reflowed together. Therefore, the OSA must withstand the heat applied during solder reflow. This procedure can affect the reliability of the OSA and host PWA, and, in addition, limits the repairability of the apparatus in the field.

SUMMARY OF THE INVENTION

It is therefore an object of the present invention to provide an adapter that will allow a single transceiver to mate with multiple electrical contact footprints.

It is a further object to provide an OSA configuration that does not require additional manual soldering operations to connect a transceiver to a host PWA.

It is yet another object to provide an OSA configuration that does not require additional tools to connect a transceiver to a host PWA, or require tools for removal.

It is yet another object to provide an adapter that allows for the installation of existing transceivers in existing host PWAs.

According to a first broad aspect of the present invention, there is provided a transceiver adapter that includes a substrate, including electrical contacts on a first side thereof for electrically contacting a transceiver, and electrical contacts on a second side thereof for electrically contacting a printed wire assembly.

According to a second broad aspect of the invention, there is provided a transceiver adapter that includes an adapter plate, including (a) tabs for positioning a transceiver, and (b) mounting pins for coupling the adapter plate with a printed wire assembly; and a substrate hole through which a transceiver may be electrically mated with a printed wire assembly.

According to a third broad aspect of the present invention, there is provided a transceiver that includes electrical contacts; and a mateable electrical connector, including (a) electrical contacts on a first side thereof for electrically contacting the electrical contacts of the transceiver, and (b) electrical contacts on a second side thereof for electrically contacting a printed wire assembly.

Other objects and features of the present invention will be apparent from the following detailed description of the preferred embodiment.

BRIEF DESCRIPTION OF THE DRAWINGS

The invention will be described in conjunction with the accompanying drawings, in which:

FIG. 5B illustrates in schematic form an alternative embodiment of an adapter mounting pin of the present invention;

FIG. 5C illustrates in schematic form an alternative embodiment of an adapter mounting pin of the present invention;

FIG. 11C is a top perspective view of a transceiver coupled to the adapter of FIG. 11B;

FIG. 12A is a top perspective view of a transceiver coupled to an adapter of the present invention;

FIG. 12B is a bottom perspective view of a transceiver coupled to an adapter of the present invention;

DETAILED DESCRIPTION OF THE PREFERRED EMBODIMENT

Figure 1:
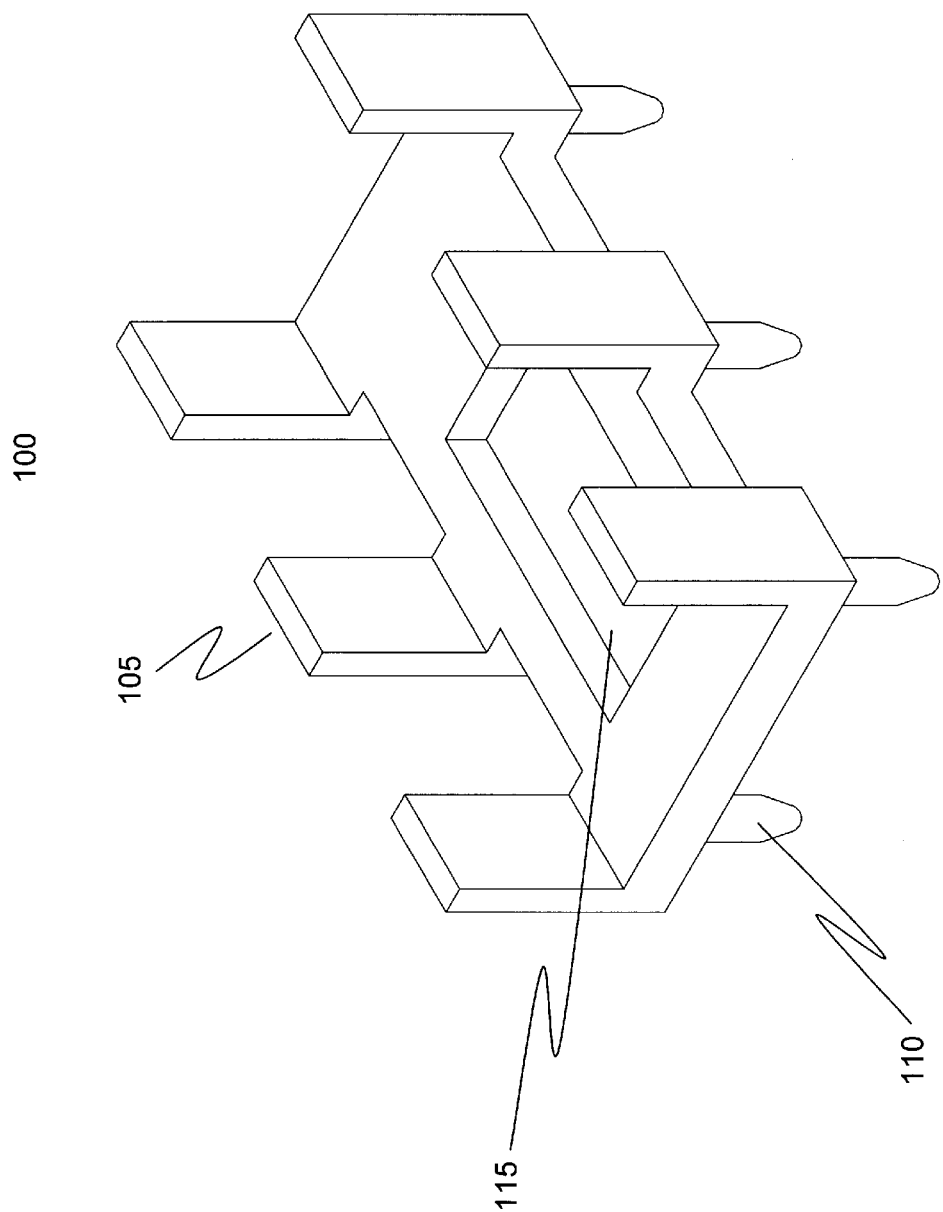
FIG. 1 is a top perspective view of a transceiver adapter plate in accordance with an embodiment of the invention.

It is advantageous to define several terms before describing the invention. It should be appreciated that the following definitions are used throughout this application.

Definitions

Where the definition of terms departs from the commonly used meaning of the term, applicant intends to utilize the definitions provided below, unless specifically indicated.

For the purposes of the present invention, the term "footprint(s)" refers to the location and orientation of electrical and/or mechanical contacts on a host PWA.

For the purposes of the present invention, the term "OSA" refers to any Optical Sub-Assembly. These sub-assemblies include, but are not limited to: optical elements, electro-optic devices, optoelectronic devices, mechanical alignment structures, electronic devices, and interconnect means.

For the purposes of the present invention, the term "transceiver" refers to an optical transmitter, an optical receiver, or an optical transceiver.

For the purposes of the present invention, the term "unibody construction" refers to an apparatus or device that may be made from a single piece of material.

For the purposes of the present invention, the term "footprint adapting substrate" or "substrate" refers to a material that conducts or transfers an electrical signal between electrical contacts. A footprint adapting substrate or substrate allows misaligned or non-aligned electrical contacts to communicate with each other without being directly in contact.

For the purposes of the present invention, the term "mating" refers to the electrical and/or mechanical coupling of two devices or features of an OSA, transceiver or host PWA, and "de-mating" refers to the electrical and/or mechanical decoupling of two devices or features of an OSA, transceiver or host PWA.

For the purposes of the present invention, the term "mateable electrical connector" refers to an electrical connector that is capable of repeated mating and de-mating by mechanical motion in a direction substantially non-parallel to the plane of the host PWA, and preferably in a direction substantially perpendicular to the plane of the host PWA.

For the purposes of the present invention, the term "collar clip" refers to an attachment mechanism for securing a transceiver within an adapter of the present invention. A collar clip wraps around the transceiver and extends at least partially across the top of the transceiver.

For the purposes of the present invention, the term "substrate hole" refers to a region of an adapter plate through which a transceiver may be electrically mated with a host PWA. A substrate hole is referred to as a "hole" because in at least some portion of the region of the adapter plate there is no adapter plate material. The substrate hole may be covered, filled or deposited with a footprint adapting substrate to promote electrical communication in and through the region.

Description

For clarity, like elements have been provided with like reference numerals throughout except that a prime has been added to each reference numeral where there is a slight difference in that particular element in that particular embodiment.

The present invention addresses the issue of the interchangeability of transceivers with various electrical contact footprints. The present invention provides a transceiver adapter that includes a substrate, including electrical contacts on a first side thereof for electrically contacting a transceiver, and electrical contacts on a second side thereof for electrically contacting a printed wire assembly. A transceiver adapter is also provided that includes an adapter plate, including (a) tabs for positioning a transceiver, and (b) mounting pins for coupling the adapter plate with a printed wire assembly; and a substrate hole through which a transceiver may be electrically mated with a printed wire assembly. A transceiver is also provided that includes electrical contacts; and a mateable electrical connector, including (a) electrical contacts on a first side thereof for electrically contacting the electrical contacts of the transceiver, and (b) electrical contacts on a second side thereof for electrically contacting a printed wire assembly.

Figure 2:
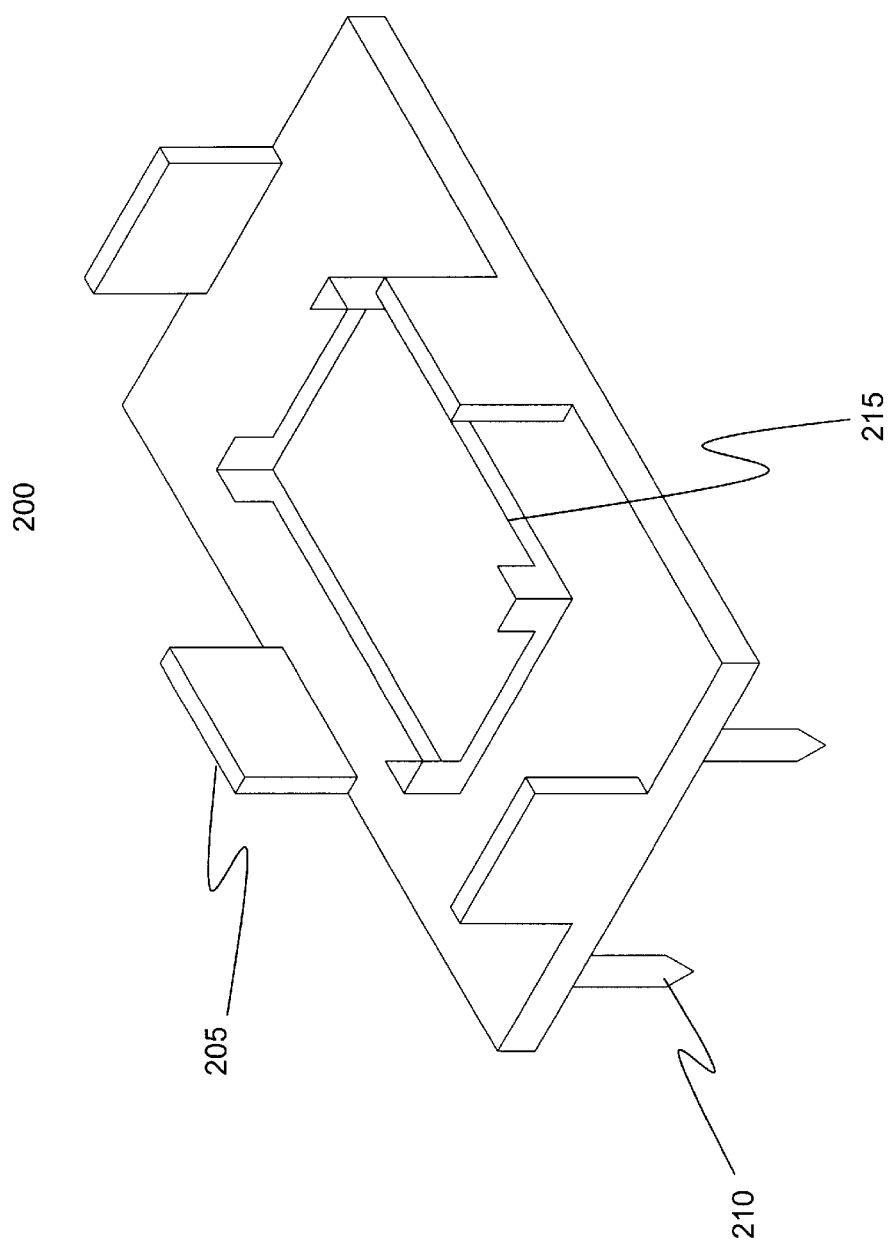
FIG. 2 is a top perspective view of a transceiver adapter plate in accordance with an embodiment of the invention.
Figure 3:
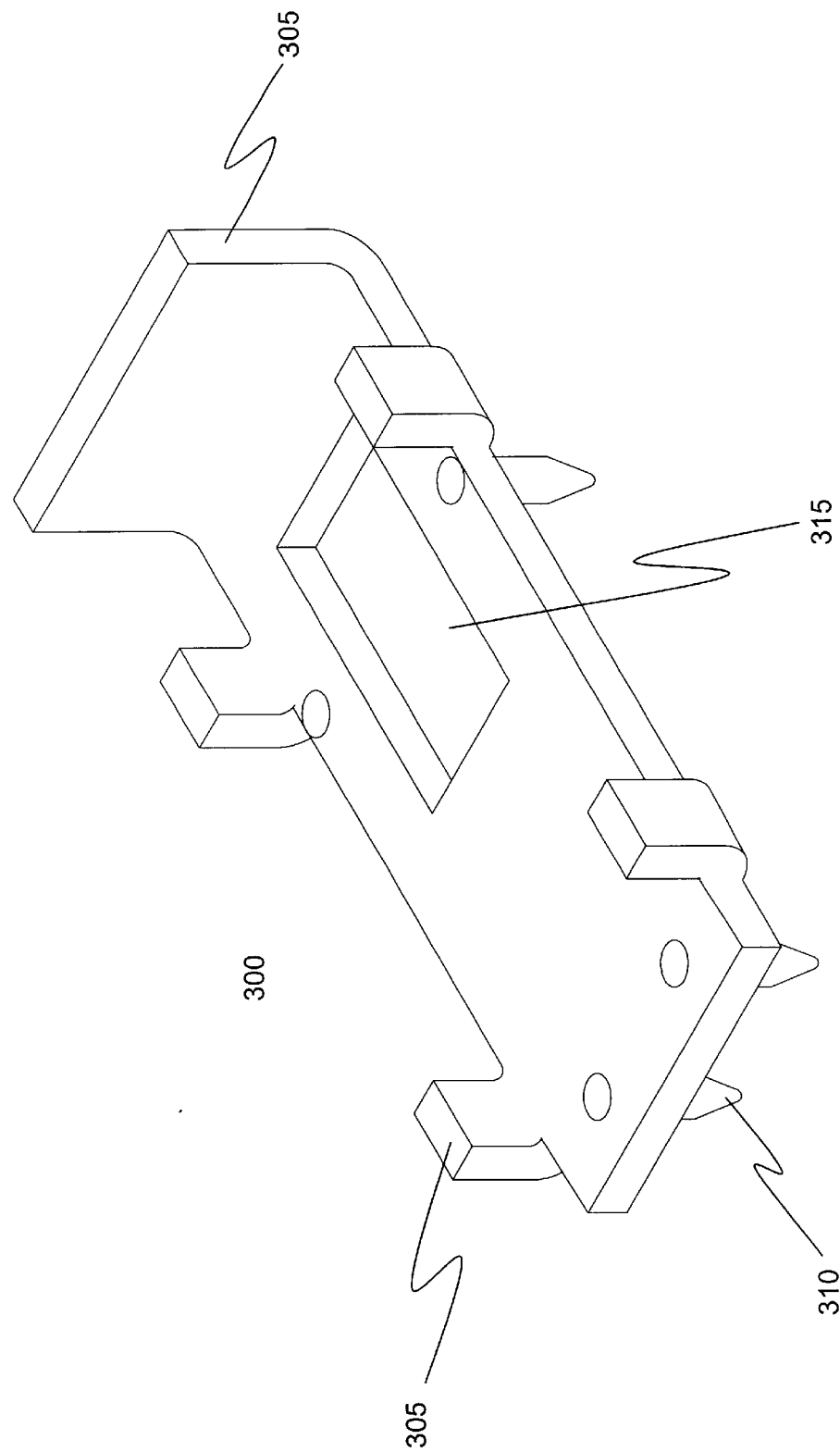
FIG. 3 is a top perspective view of a transceiver adapter plate in accordance with an embodiment of the invention.

FIGS. 1, 2 and 3 illustrate alternative embodiments of an adapter plate of the present invention. In FIG. 1, adapter plate 100 is configured with tabs 105 for positioning, orienting, restraining and retaining a transceiver (not shown). Mounting pins 110 provide a connection point for adapter plate 100 to be coupled with a host printed wiringe assembly (PWA) (not shown). Substrate hole 115 provides a region for establishing electrical contact between a transceiver and a host PWA. Substrate hole 115 creates a region in the material of adapter plate 100 through which electrical contacts of a transceiver may be mated with electrical contacts of a host PWA.

FIG. 2 illustrates an alternative embodiment of an adapter plate of the present invention. Adapter plate 200 is configured with tabs 205 for positioning, restraining and orienting a transceiver (not shown). Mounting pins 210 provide a connection point for adapter plate 200 to be coupled with a host PWA (not shown). Substrate hole 215 provides a region for establishing electrical contact between a transceiver and a host PWA. Substrate hole 215 creates a region in the material of adapter plate 200 through which electrical contacts of a transceiver may be mated with electrical contacts of a host PWA.

FIG. 3 illustrates an alternative embodiment of an adapter plate of the present invention. Adapter plate 300 is configured with tabs 305 for positioning, restraining and orienting a transceiver (not shown). Mounting pins 310 provide a connection point for adapter plate 300 to be coupled with a host PWA (not shown). Substrate hole 315 provides a region for establishing electrical contact between a transceiver and a host PWA. Substrate hole 315 creates a region in the material of adapter plate 300 through which electrical contacts of a transceiver may be mated with electrical contacts of a host PWA.

A substrate hole provides a region in which a footprint adapting substrate may be inserted or deposited to provide electrical communication between electrical contacts that are not aligned or are misaligned. The nonalignment or misalignment may be due to incompatibility of the elements of the assembly or may be due to error in manufacture or design. Regardless, the footprint adapting substrate allows misaligned or nonaligned electrical contacts to communicate with each other without being directly in contact. The footprint adapting substrate may be of any suitable conducting material such as a metal, for example, steel or copper. Depending on the application of the present invention, the footprint adapting substrate may have electrical contacts on a first side of the substrate that mate with a transceiver and electrical contacts on a second side of said substrate that mate with a host PWA.

Adapter plates of the type shown in FIGS. 1, 2 and 3 may be configured with any suitable dimensions, but are preferably configured to secure a transceiver between the tabs. The tabs are not limited to being rectangular in shape, but rather may be square, rounded, angular, etc. In addition, the adapter plates may be configured with any number of tabs, such as 2, 3, 4, 5, 6, 7, etc. The tabs may be uniform in size and shape or may vary in dimension. The tabs may be positioned in any location on the adapter plate to secure the transceiver, and may possess spring latching or keying structures to retain the transceiver securely.

Figure 4A:
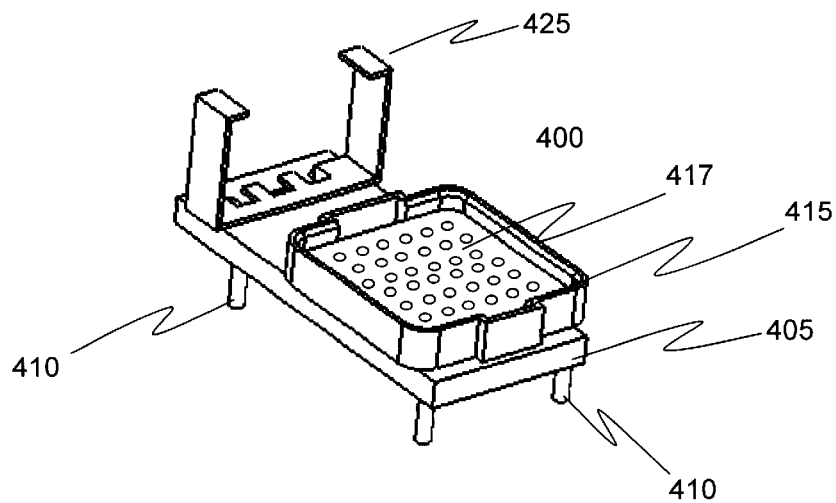
FIG. 4A is a top perspective view of a transceiver adapter in accordance with an embodiment of the invention.
Figure 4B:
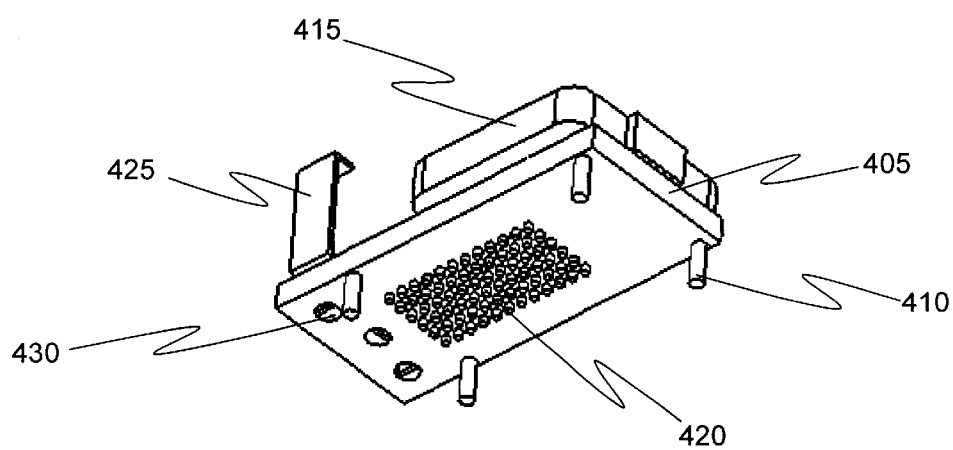
FIG. 4B is a bottom perspective view of the transceiver adapter of FIG. 4A.

FIGS. 4A and 4B show an embodiment of an adapter of the present invention. Adapter 400 is configured with substrate 405. Substrate 405 is configured with mounting pins 410 to provide a connection point for adapter 400 to be coupled with a host PWA (not shown). Mounted on substrate 405 is electrical connector 415. Electrical connector 415 provides electrical contacts 417 for aligning with the transceiver contacts (not shown). Electrical connector 415 may be a BGA connector or other suitable connector. Electrical connector 415 utilizes a ball grid array contact for attachment, for example by soldering, to substrate 405 and/or a host PWA. Electrical connector 415 utilizes blade contacts or other suitable contacts for the mate/demate interface between electrical connector 415 mating halves.

Figure 4C:
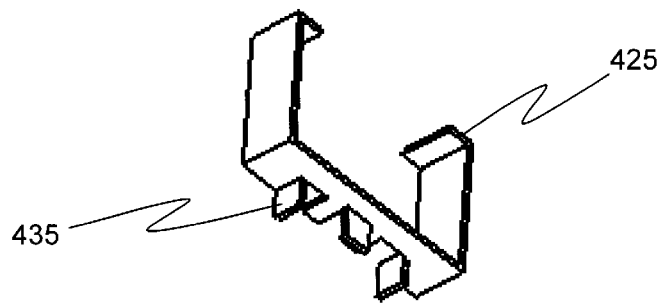
FIG. 4C is a bottom perspective view of an adapter clip as shown in FIGS. 4A and 4B.

Electrical contacts 420 are shown in FIG. 4B. Electrical contacts 420 provide electrical contact between substrate 405 and a host PWA. Adapter 400 is also configured with collar clip 425 for securing a transceiver in adapter 400. As shown in FIG. 4C, collar clip 425 has connecting tabs 435 that fit into holes 430 (shown in FIG. 4B) to secure collar clip 425 to adapter plate 405.

The mounting pins shown, for example, in FIGS. 1, 2, 3, 4A and 4B and the connecting tabs shown, for example, in FIG. 4C may be configured in any suitable shape, such as cylindrical, tabular, squared, pointed, etc. The pins or tabs are preferably configured to correspond to the hole or region in which the pins or tabs will reside. The clip shown in FIGS. 4A, 4B and 4C may be mounted on an adapter plate or substrate and the adapter plate or substrate may be mounted on a host PWA by a variety of methods. For example, the mounting pins of the adapter plate or substrate may be soldered into a host PWA or the mounting pins may be pressed into undersized openings that allow the mounting pins to be held by the force of friction. In addition, the tabs or pins may snap into a suitable orifice on the adapter plate, substrate or host PWA. Preferably, the mounting pins or tabs have a length sufficient to secure the devices during soldering and/or further manipulation.

Figure 5A:
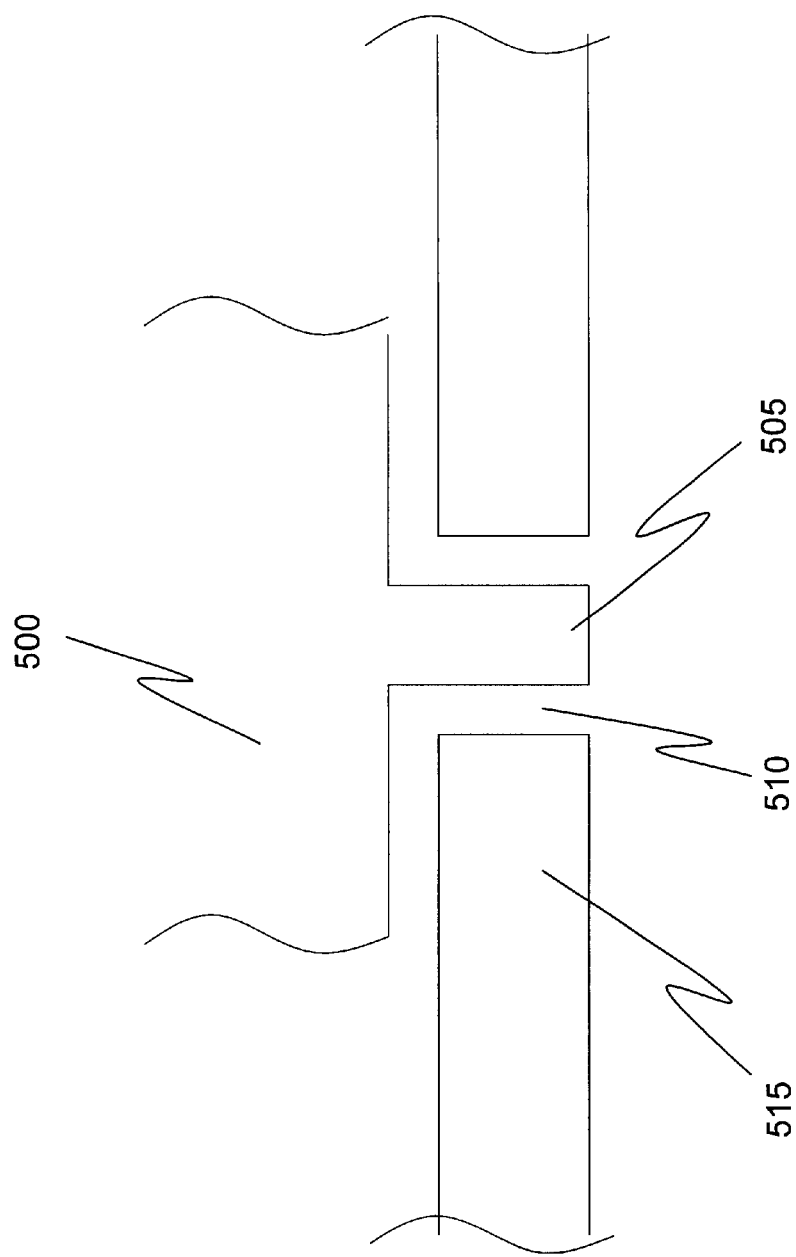
FIG. 5A illustrates in schematic form an embodiment of an adapter mounting pin of the present invention.

FIGS. 5A, 5B and 5C show alternative methods of securing an adapter plate or substrate to a host PWA. In FIG. 5A, adapter plate or substrate 500 has mounting pin 505. Mounting pin 505 fits into receiving hole 510 in host PWA 515. In this embodiment, mounting pin 505 may be secured in host PWA 515 by soldering, friction, or other suitable means.

FIG. 5B shows adapter plate or substrate 500' with mounting pin 505'. Mounting pin or stud 505' is at least partially hollowed out and threaded for receiving a screw 520'. Adapter plate or substrate 500' may thus be secured to host PWA 515' by connecting and tightening screw 520' in mounting pin 505'.

FIG. 5C shows adapter plate or substrate 500" configured without a mounting pin. Instead, adapter plate or substrate 500" has a mounting socket or region 525" in a bottom surface of adapter plate or substrate 500" for receiving a screw 520". Adapter plate or substrate 500" may thus be secured to host PWA 515" by connecting and tightening screw 520" directly in adapter plate or substrate 500".

The screws shown, for example, in FIGS. 5B and 5C should be of sufficient length to extend through a host PWA and to securely connect an adapter plate or substrate to the host PWA.

Figure 6A:
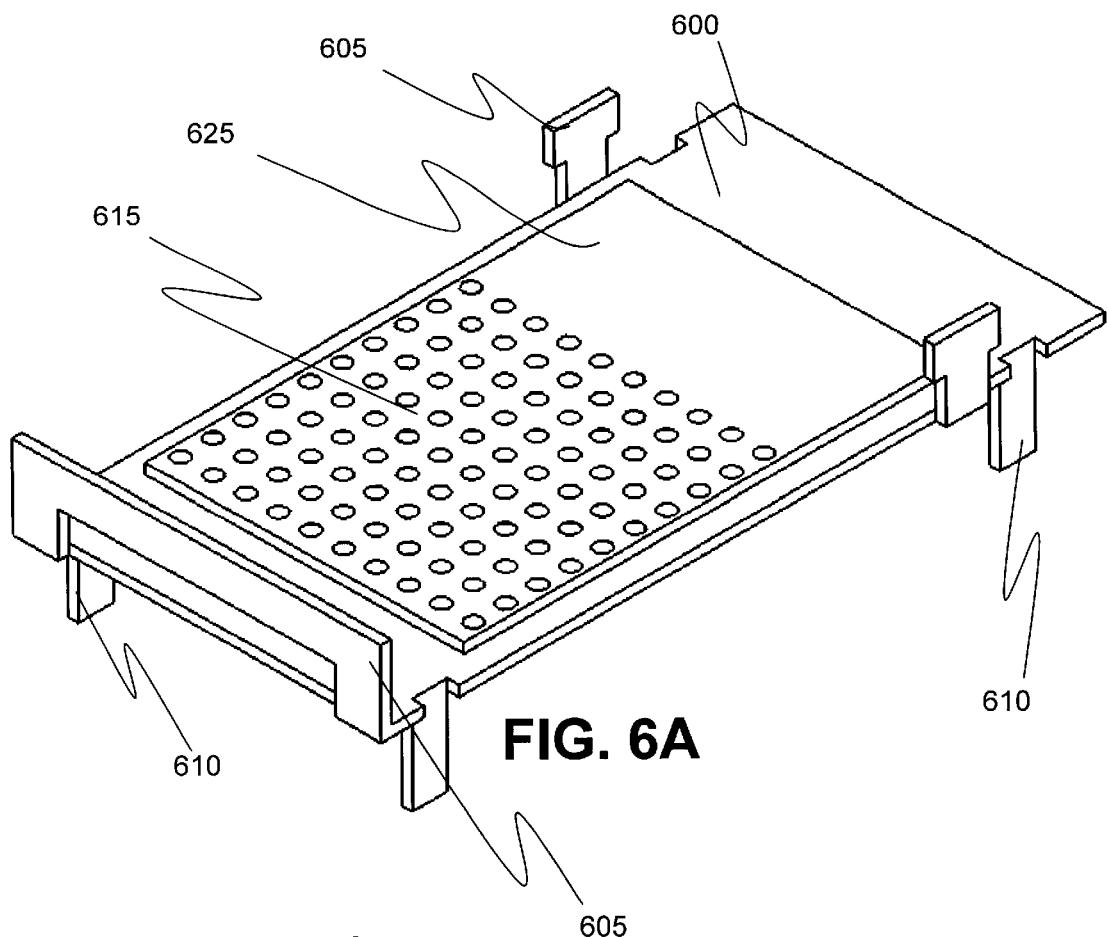
FIG. 6A is a top perspective view of an adapter of the present invention.
Figure 6B:
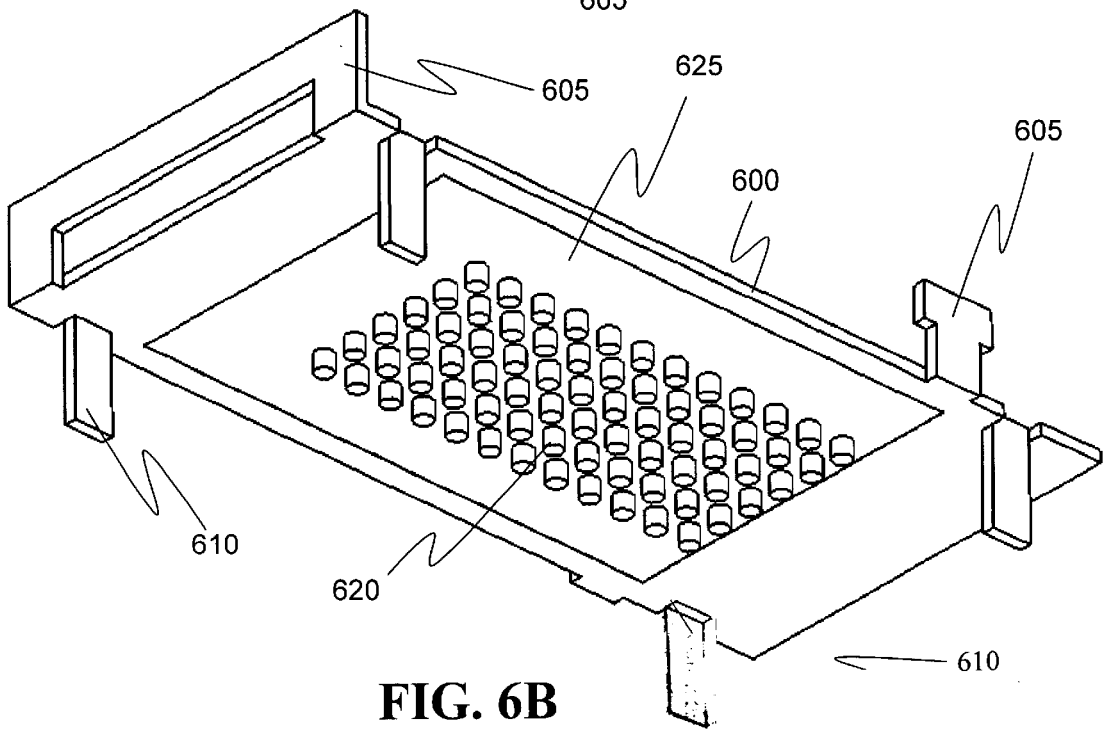
FIG. 6B is a bottom perspective view of the adapter of FIG. 6A.

FIGS. 6A and 6B show top and bottom views, respectively, of an embodiment of an adapter of the present invention. Adapter plate 600 is configured with tabs 605 for positioning, restraining and orienting a transceiver (not shown). Adapter plate 600 is configured with mounting tabs 610 to provide a connection point for the adapter to be coupled with a host PWA (not shown). Electrical contacts 615 and 620 on substrate 625 are shown in FIG. 6A and 6B, respectively. Electrical contacts 615 provide electrical contact between the adapter and a transceiver. Electrical contacts 620 provide electrical contact between the adapter and a host PWA.

Figure 7A:
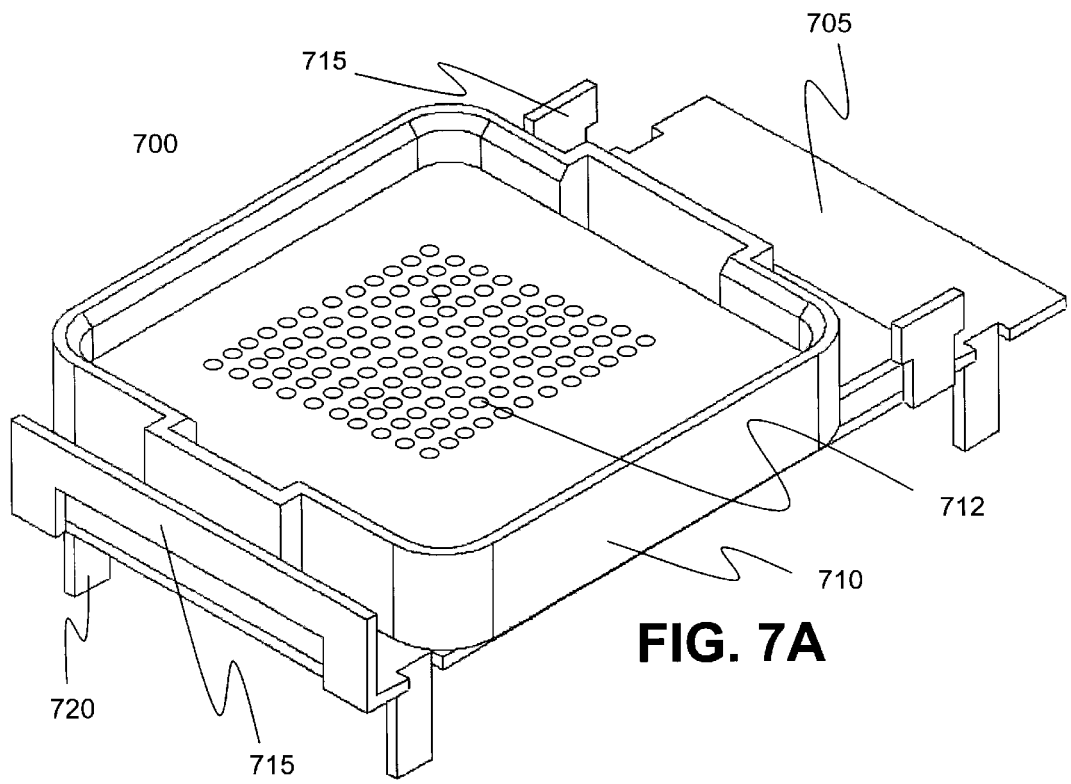
FIG. 7A is a top perspective view of an adapter according to the present invention.
Figure 7B:
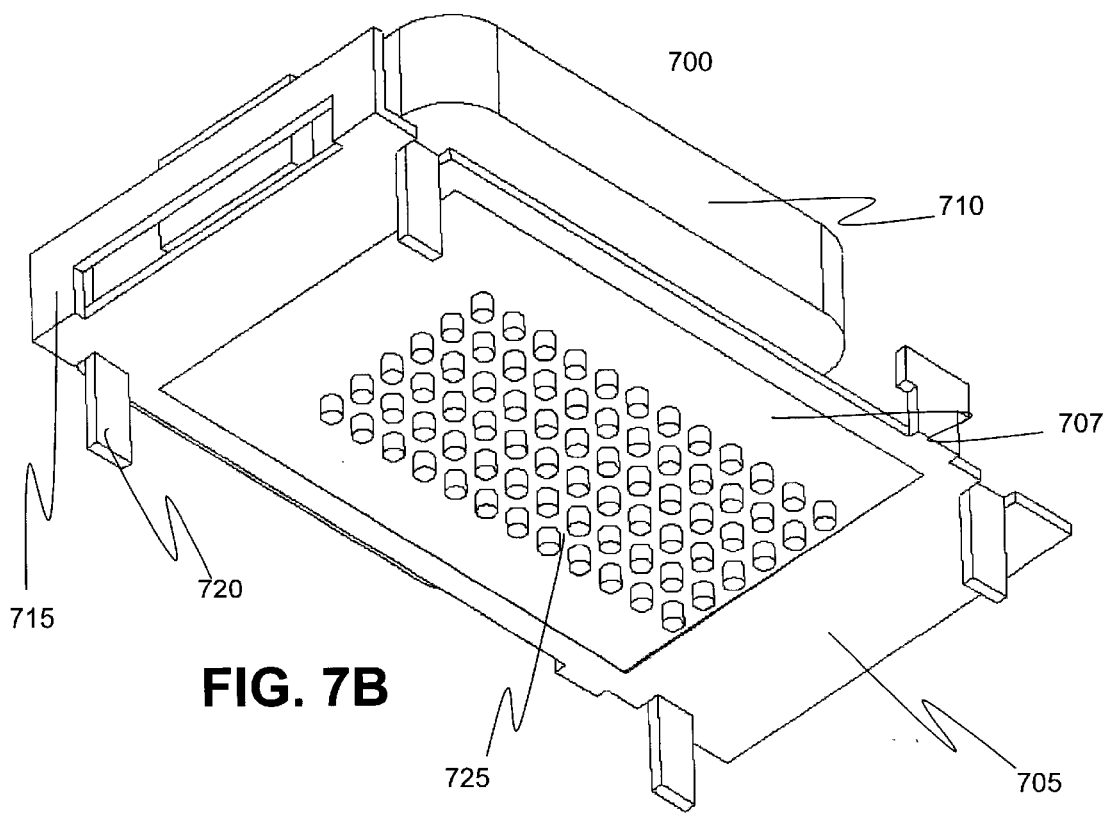
FIG. 7B is a bottom perspective view of an adapter according to the present invention.

FIGS. 7A and 7B show an adapter 700 with adapter plate 705 and electrical connector 710 mounted thereon. Electrical connector 710 provides electrical contacts 712 for aligning with the transceiver contacts (not shown). Electrical contacts 725 provide electrical contact between the adapter and a host PWA. Adapter plate 705 is also configured with tabs 715 for positioning, restraining and orienting a transceiver (not shown). Mounting tabs 720 provide a connection point for adapter plate 705 to be coupled with a host PWA (not shown).

The electrical contact arrays of the present invention may have similar or different patterns on the substrates and may provide a direct electrical path from top to bottom of the substrates, as determined by circuit traces in the substrate layers.

It is to be understood by one of ordinary skill in the art that any suitable mechanical connecting means, such as snaps, pins, screws, tabs, solder, etc. may be used to couple the adapter plate or substrate to a host PWA.

Figure 8A:
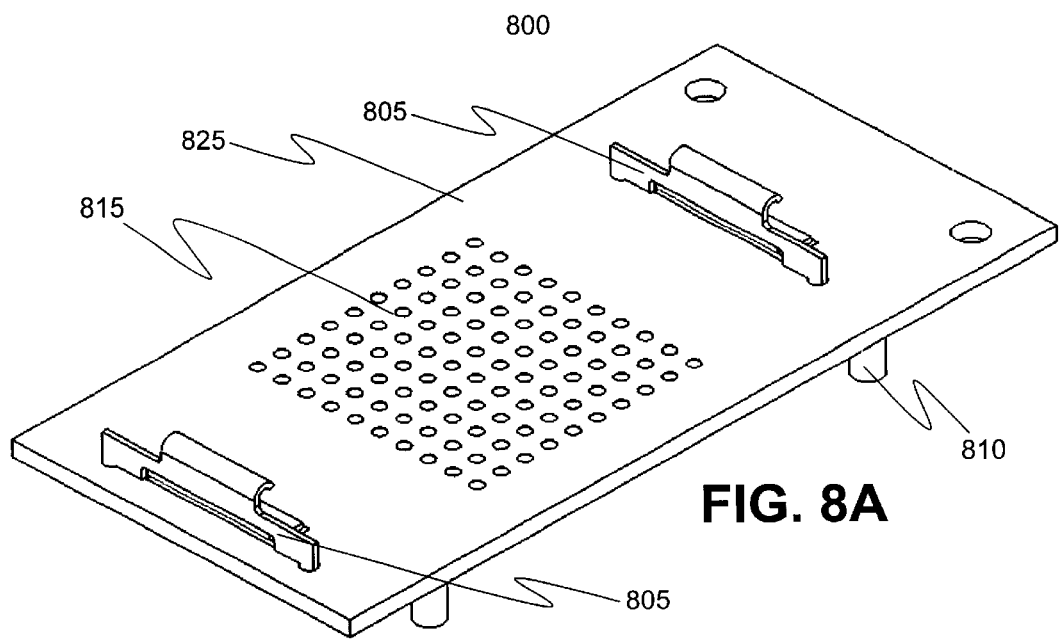
FIG. 8A is a top perspective view of an alternative embodiment of an adapter of the present invention.
Figure 8B:
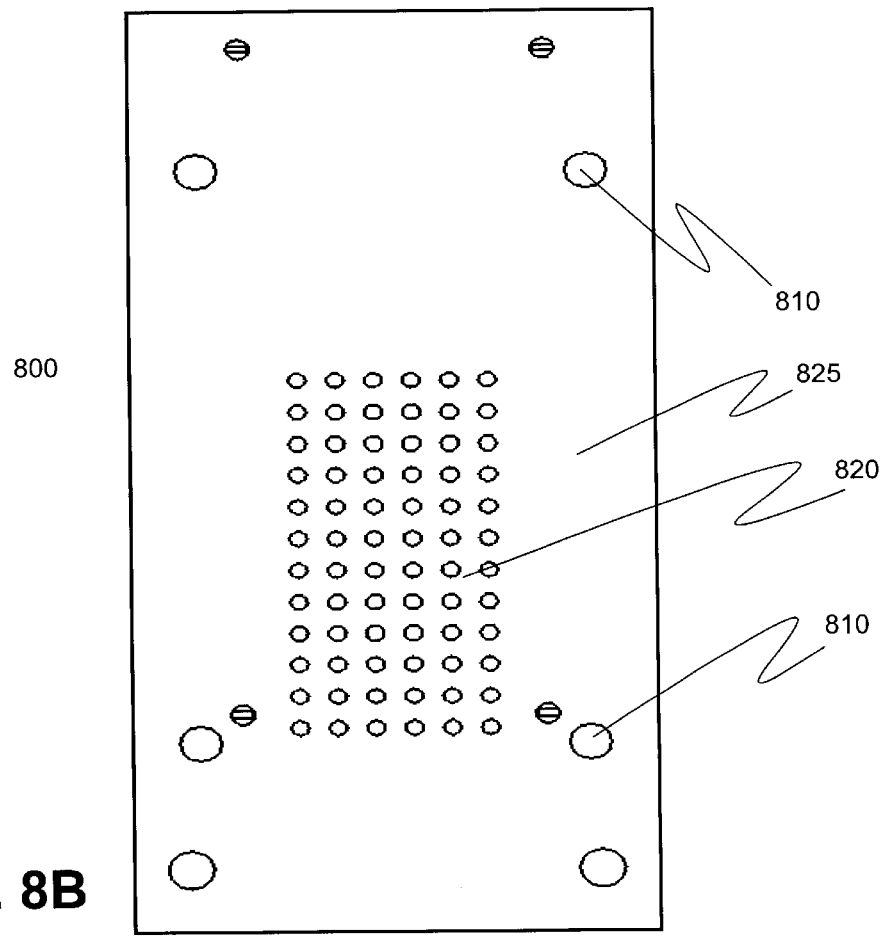
FIG. 8B is a bottom plan view of the adapter of FIG. 8A.

FIGS. 8A and 8B illustrate an embodiment of adapter 800 according to the present invention. Adapter 800 is configured with transceiver mounting clips 805. Transceiver mounting clips 805 mechanically couple with a transceiver (not shown) to secure the transceiver to substrate 825. Adapter 800 is also configured with mounting pins 810. Mounting pins 810 provide a connection point for adapter 800 to be coupled with a host PWA (not shown). Electrical contacts 815 and 820 are shown in FIGS. 8A and 8B, respectively. Electrical contacts 815 provide electrical contact between adapter 800 and a transceiver. Electrical contacts 820 provide electrical contact between adapter 800 and a host PWA.

Figure 9A:
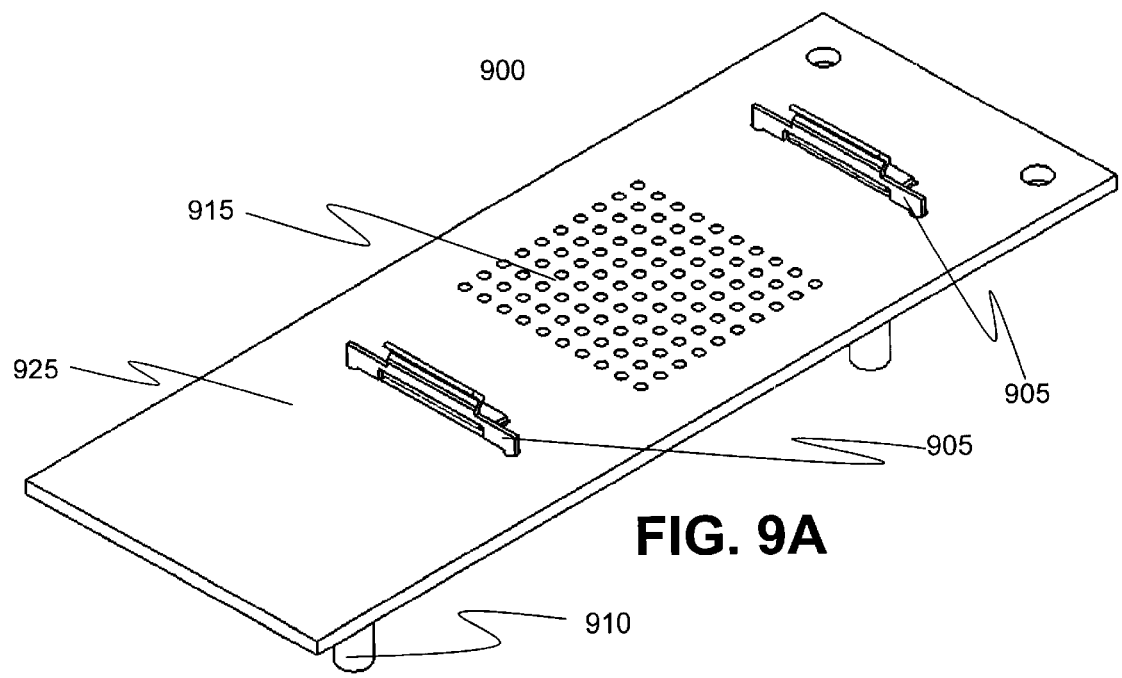
FIG. 9A is a top perspective view of an alternative embodiment of an adapter of the present invention.
Figure 9B:
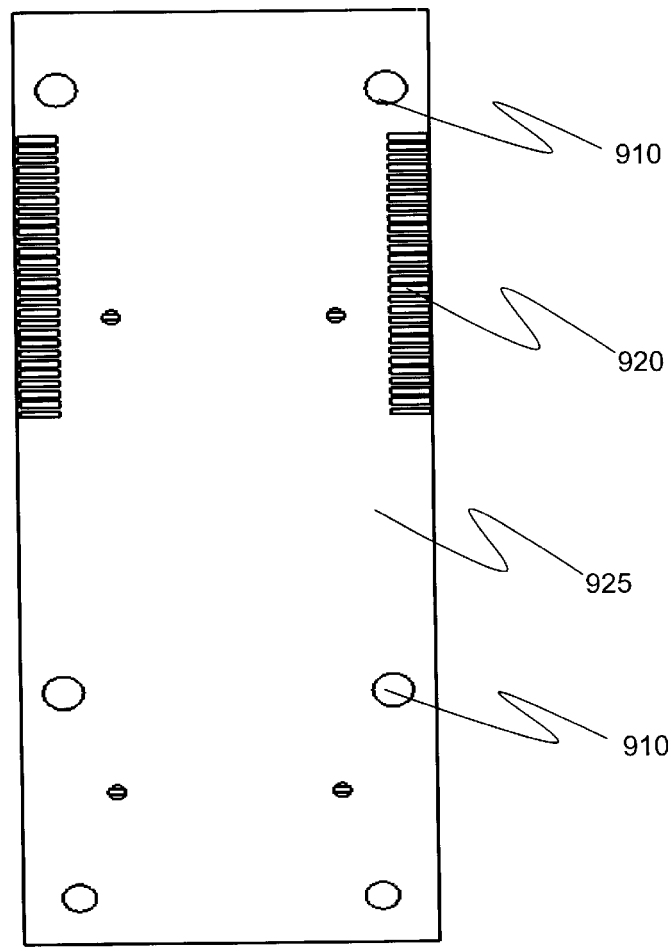
FIG. 9B is a bottom plan view of the adapter of FIG. 9A.

FIGS. 9A and 9B illustrate an alternative embodiment of an adapter of the present invention. Adapter 900 is configured with transceiver mounting clips 905. Transceiver mounting clips 905 mechanically couple with a transceiver (not shown) to secure the transceiver to substrate 925. Adapter 900 is also configured with mounting pins 910. Mounting pins 910 provide a connection point for adapter 900 to be coupled with a host PWA (not shown). Electrical contacts 915 and 920 are shown in FIGS. 9A and 9B, respectively. Electrical contacts 915 provide electrical contact between adapter 900 and a transceiver. Electrical contacts 920 provide electrical contact between adapter 900 and a host PWA.

Figure 10A:
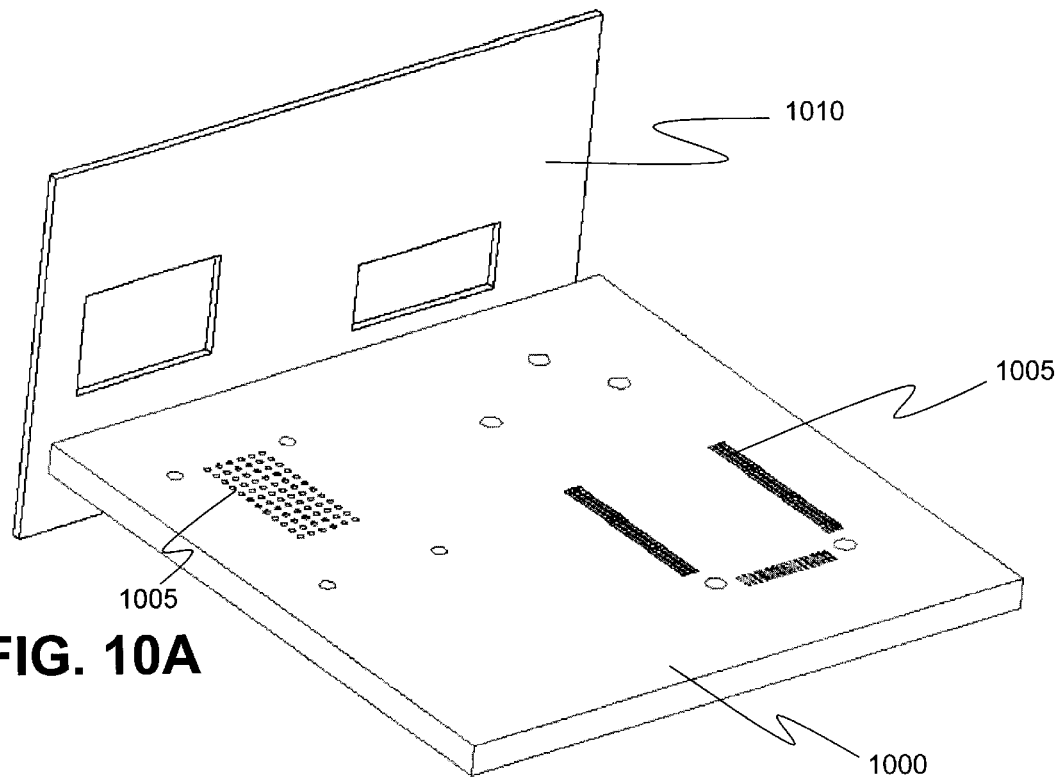
FIG. 10A is a top perspective view of a printed wire assembly according to the present invention showing two different electrical contact footprints.
Figure 10B:
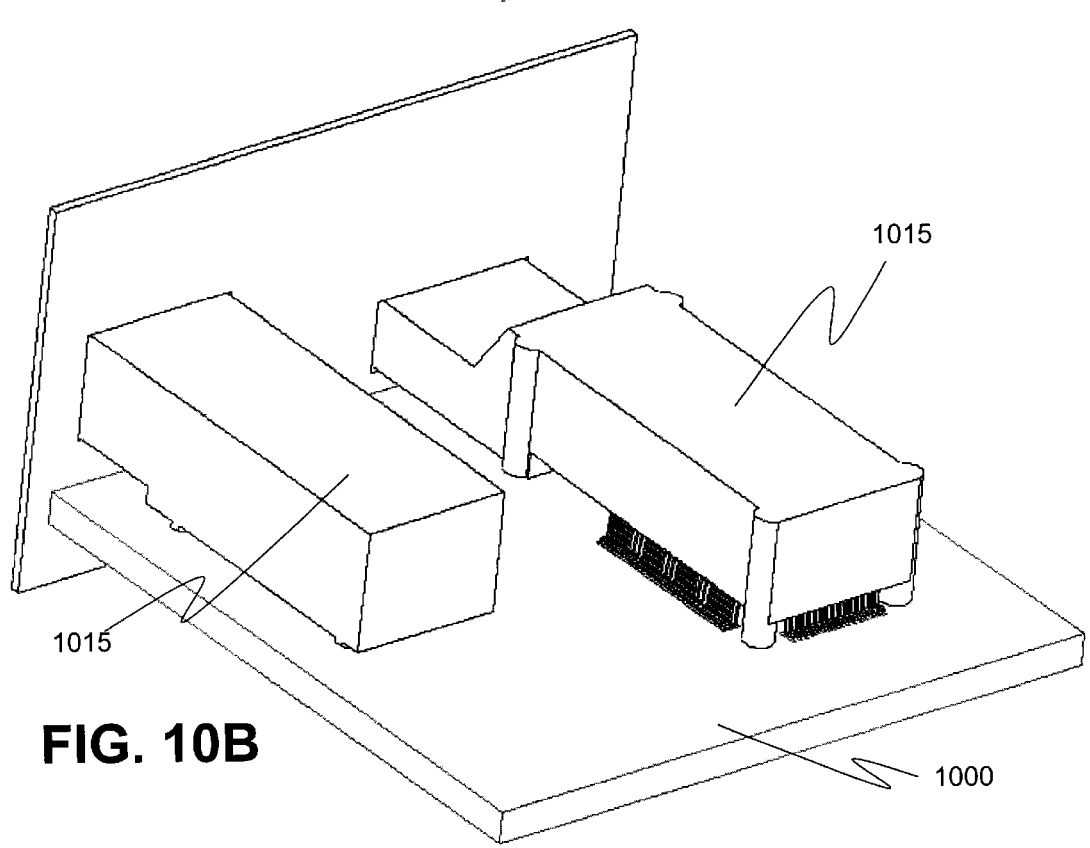
FIG. 10B is a top perspective view of two transceivers configured to contact the printed wire assembly shown in FIG. 10A.

FIG. 10A shows exemplary electrical contact footprints 1005 on a host PWA 1000 coupled with chassis 1010. FIG. 10B shows transceivers 1015 coupled with host PWA 1000. Each transceiver 1015 specifically mates with electrical contact footprints 1005.

Figure 11A:
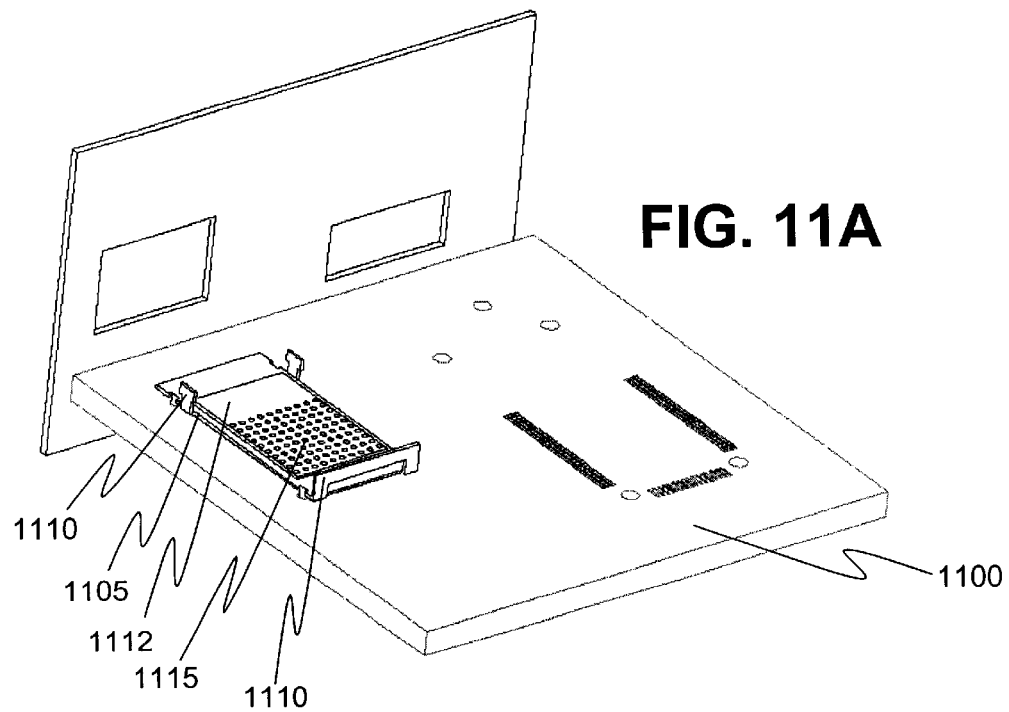
FIG. 11A is a top perspective view of a printed wire assembly with an adapter of the present invention mounted thereon.
Figure 11B:
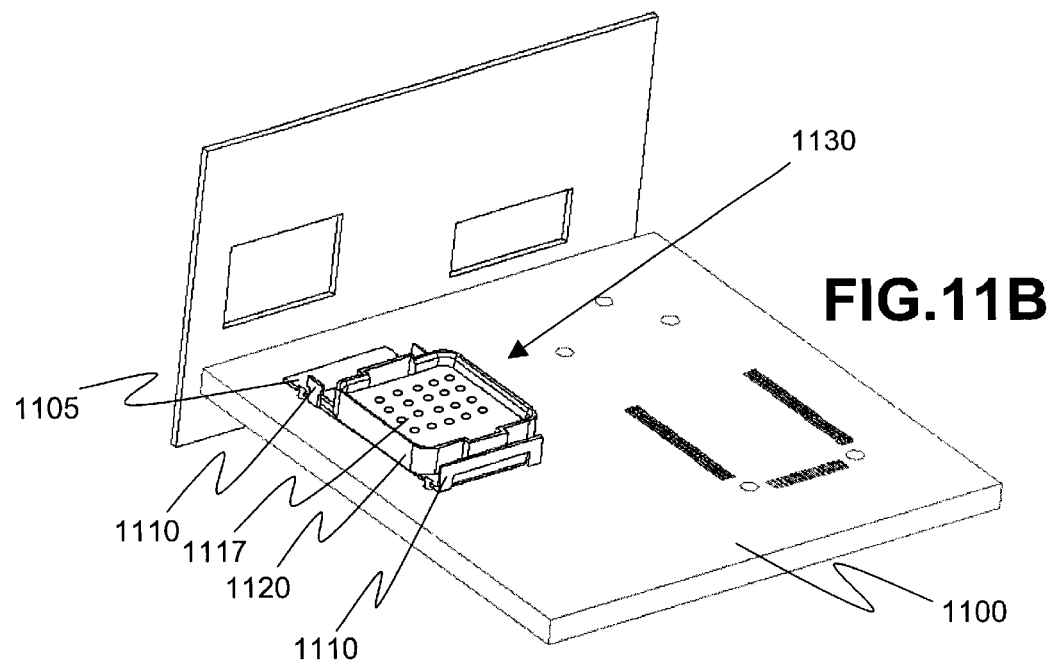
FIG. 11B is a top perspective view of the adapter of FIG. 11A with an electrical connector mounted thereon.

FIG. 11A shows an embodiment of an adapter 1105 of the present invention coupled with an electrical contact footprint (not shown) on host PWA 1100. Adapter plate 1105 is shown with tabs 1110 for securing a transceiver to substrate 1112. Substrate 1112 is configured with electrical contacts 1115. Electrical contacts 1115 provide electrical contact between substrate 1112 and a transceiver. FIG. 11B shows an electrical connector 1120 mounted on substrate 1112. Electrical connector 1120 provides electrical contacts 1117 for electrically connecting the transceiver contacts (not shown) with electrical contacts 1115. FIG. 11C shows a transceiver 1125 coupled with adapter 1130. Adapter 1130 is shown with electrical connector 1120 mounted on substrate 1112 on adapter plate 1105. Adapter 1130 is also shown with tabs 1110 for securing transceiver 1125 to adapter plate 1105.

FIGS. 12A and 12B show transceiver 1200 coupled with adapter 1205. Adapter 1205 is shown with electrical connector 1210 mounted on substrate 1212 on adapter plate 1215. Adapter 1205 is also shown with tabs 1220 for securing transceiver 1200 to adapter plate 1215. Tabs 1220 are configured to interact with cutouts 1225 located on transceiver 1200. Adapter plate 1215 is configured with mounting tabs 1230 to provide a connection point for adapter plate 1215 to be coupled with a host PWA (not shown). Electrical contacts 1235 are shown in FIG. 12B. Electrical contacts 1235 provide electrical contact between substrate 1212 and a host PWA.

Figure 13A:
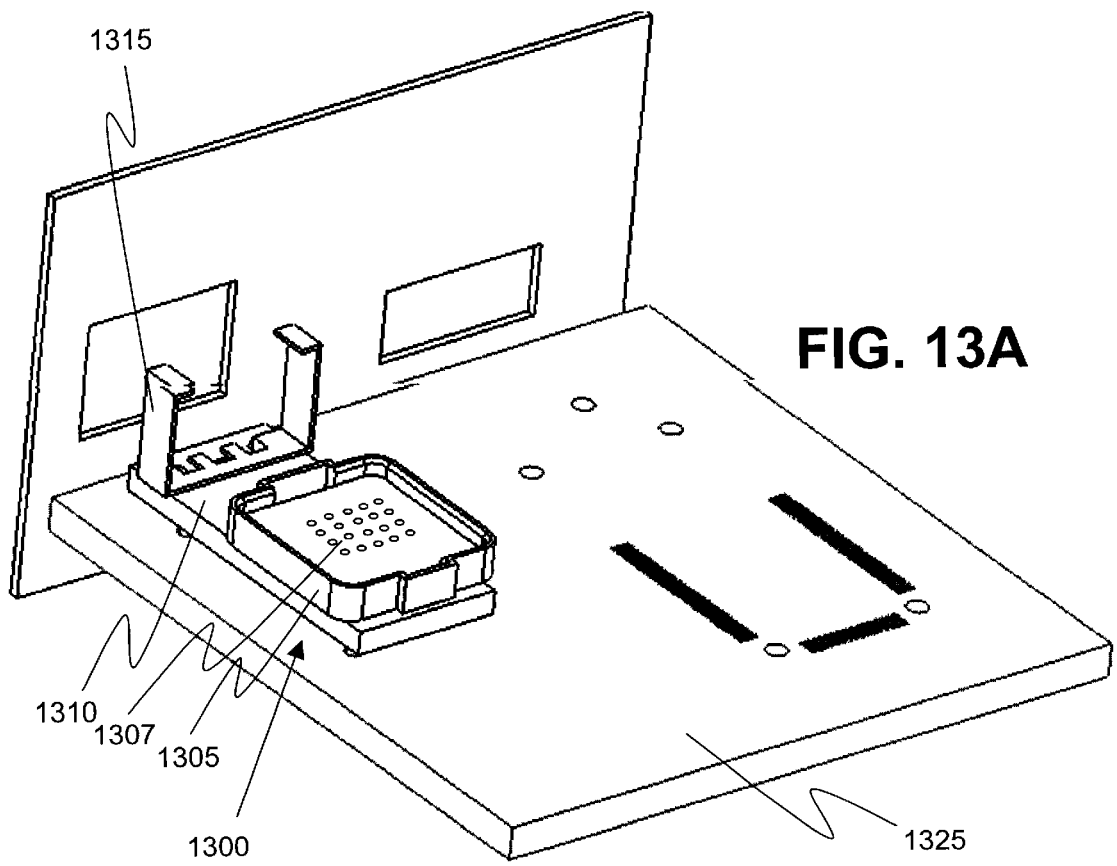
FIG. 13A is a top perspective view of an alternative embodiment of an adapter of the present invention.
Figure 13B:
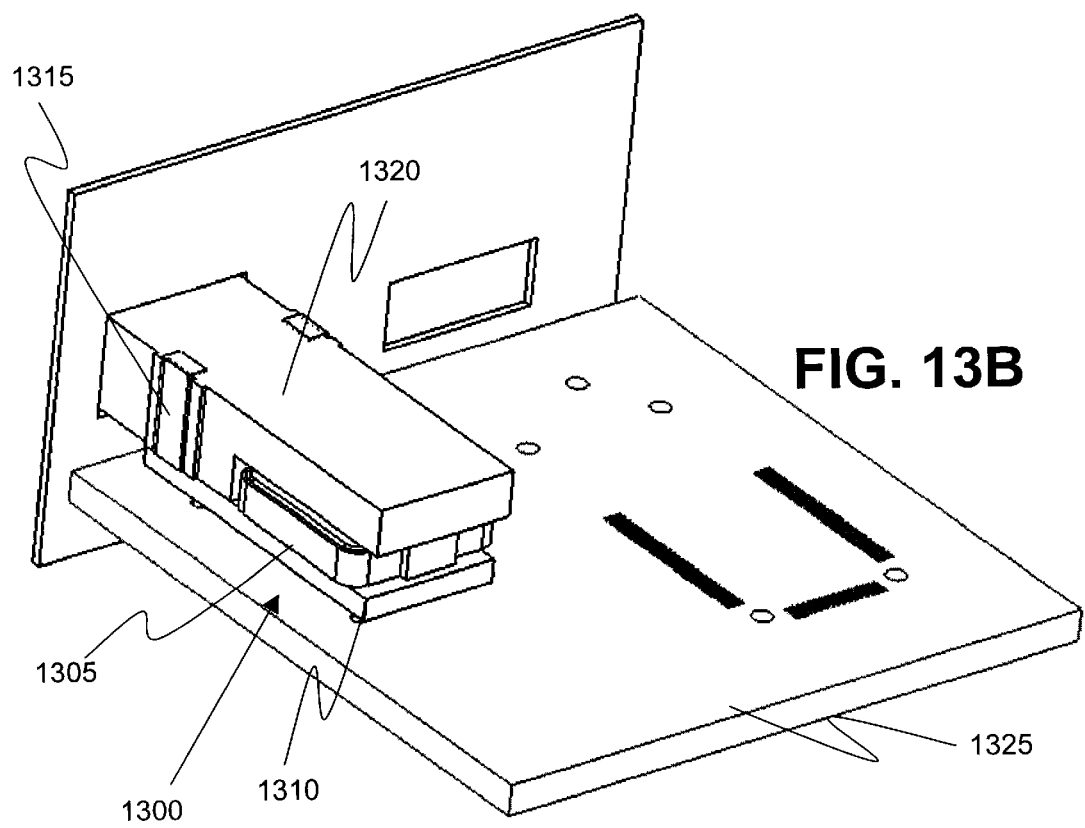
FIG. 13B is a top perspective view of a transceiver coupled to the adapter of FIG. 13A.

FIGS. 13A and 13B show an alternative embodiment of an adapter of the present invention coupled with an electrical contact footprint (not shown) on host PWA 1325. Adapter 1300 is shown with electrical connector 1305 mounted on substrate 1310. Electrical connector 1305 provides electrical contacts 1307 for electrically connecting with the transceiver contacts (not shown). Adapter 1300 is also shown with clip 1315 for securing transceiver 1320 to adapter 1300.

Figure 14A:
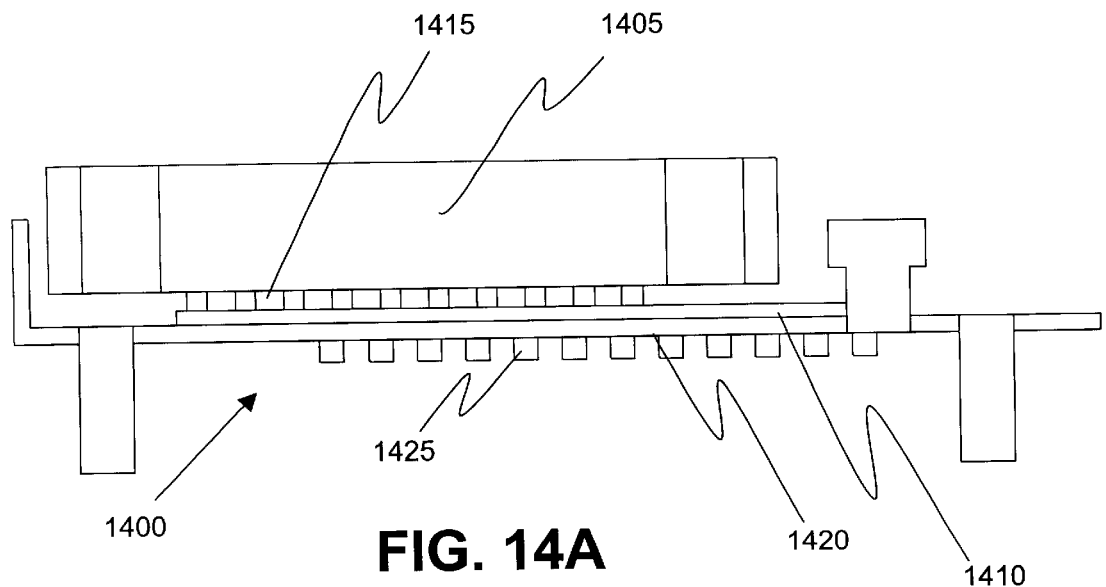
FIG. 14A illustrates in schematic form an alternative embodiment of an adapter of the present invention.
Figure 14B:
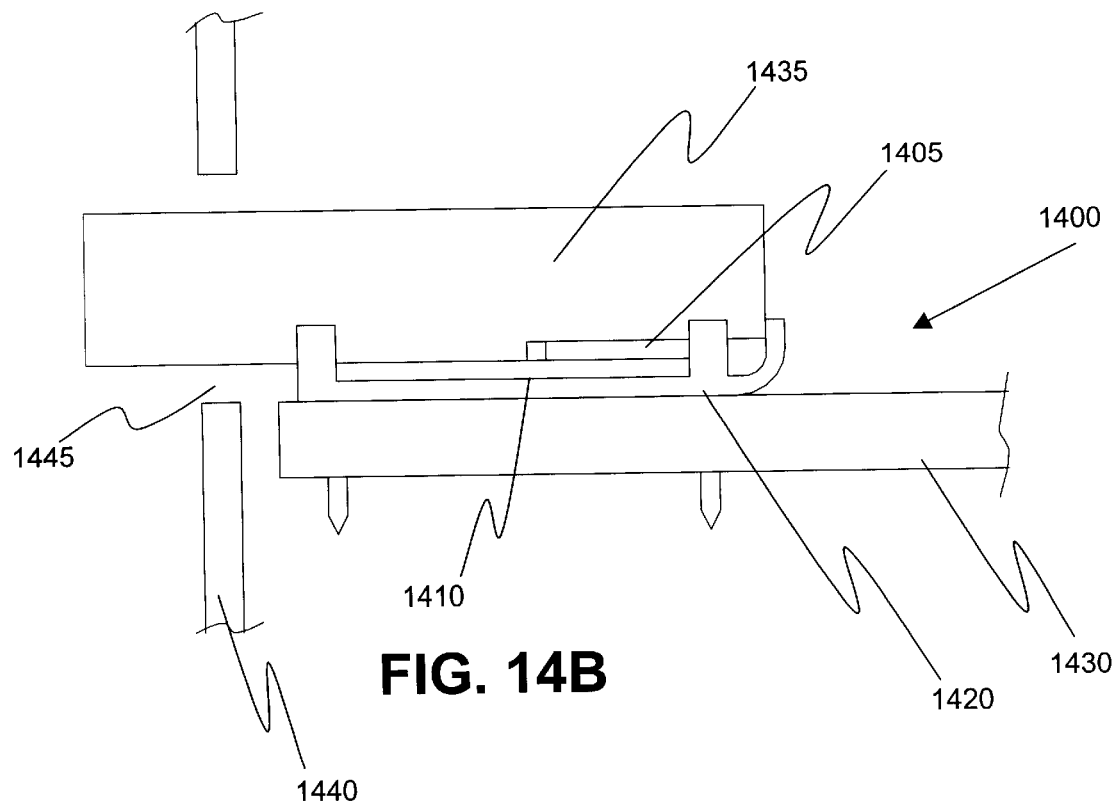
FIG. 14B illustrates in schematic form an alternative embodiment of an adapter of the present invention mounted on a printed wire assembly.

FIGS. 14A and 14B show an embodiment of an adapter of the present invention. Adapter 1400 is configured with electrical connector 1405 in electrical contact with a footprint adapting substrate 1410. Footprint adapting substrate 1410 provides electrical communication between electrical connector electrical contacts 1415 and adapter 1400. FIG. 14B shows the coupling of transceiver 1435 with adapter 1400 and the coupling of adapter 1400 with host PWA 1430. FIG. 14B also shows the extension of transceiver 1435 through chassis 1440 at chassis opening 1445. Adapter plate 1420 is configured with electrical contacts (not shown) that interact with footprint adapting substrate 1410. Adapter plate 1420 is also configured with electrical contacts 1425 to provide an electrical contact between adapter plate 1420 and a host PWA 1430.

Figure 15A:
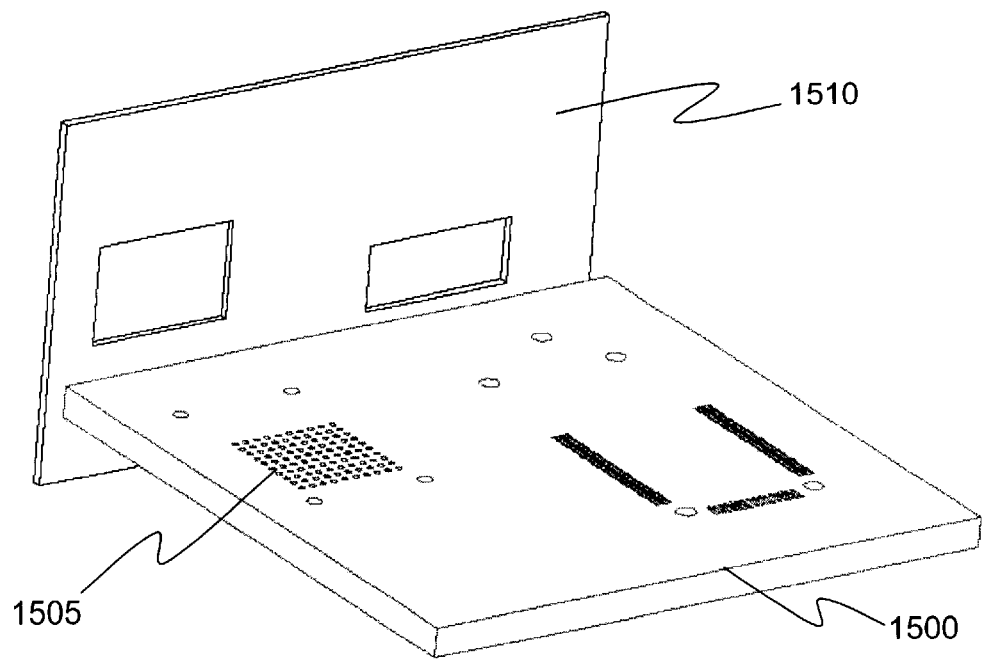
FIG. 15A is a top perspective view of a printed wire assembly according to the present invention showing two different electrical contact footprints.
Figure 15B:
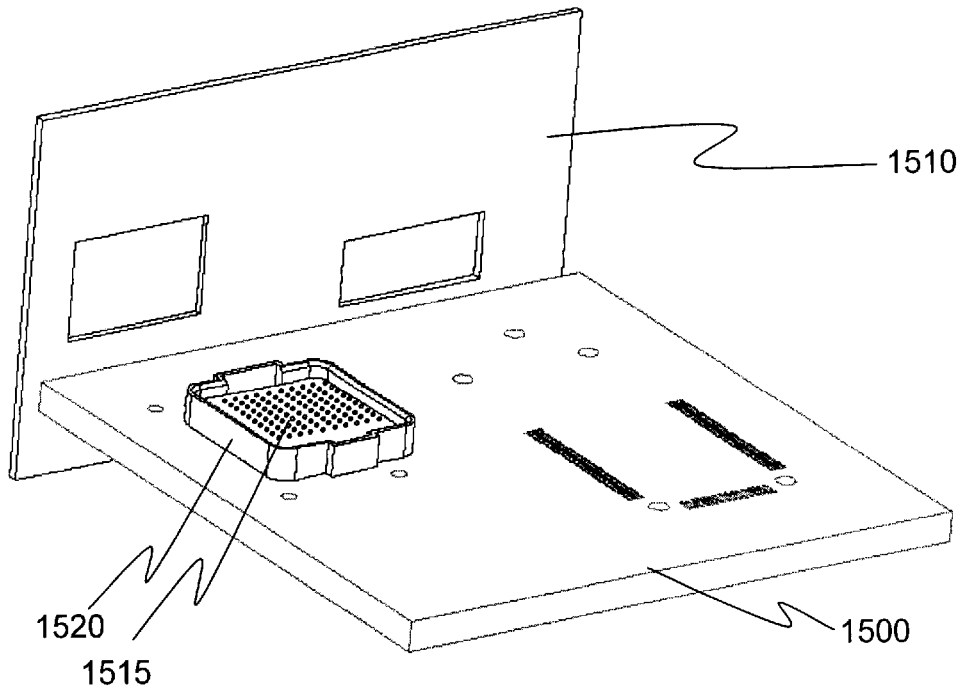
FIG. 15B is a top perspective view of the printed wire assembly of FIG. 15A with an electrical connector mounted thereon according to the present invention.
Figure 15C:
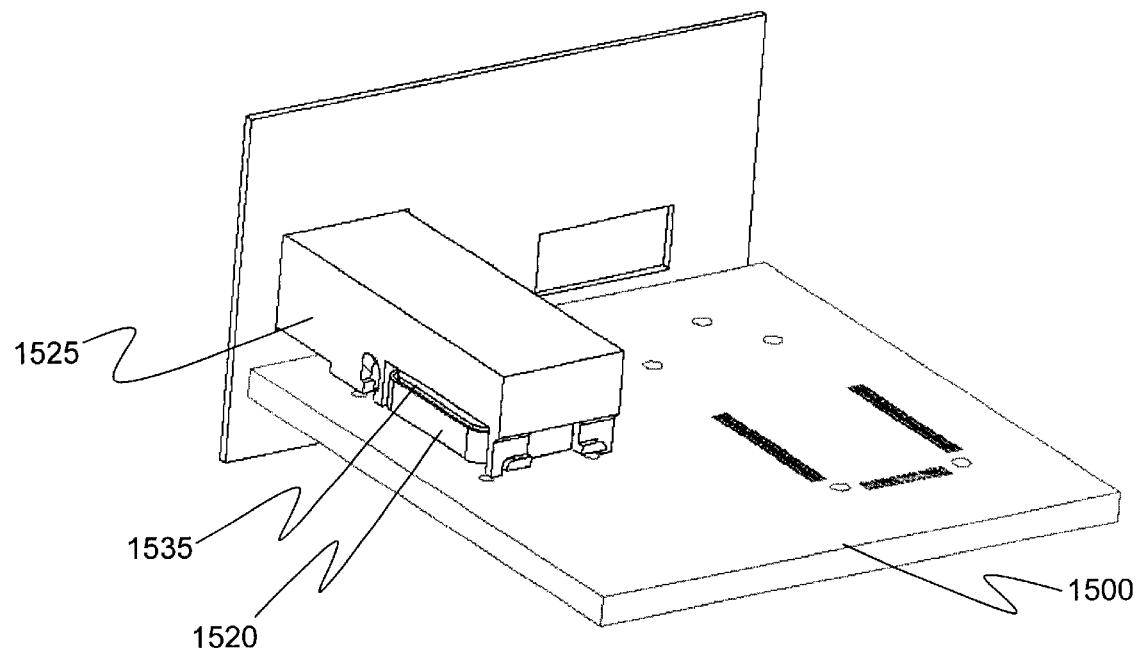
FIG. 15C is a top perspective view of a transceiver coupled to the electrical connector of FIG. 15B according to the present invention.
Figure 15D:
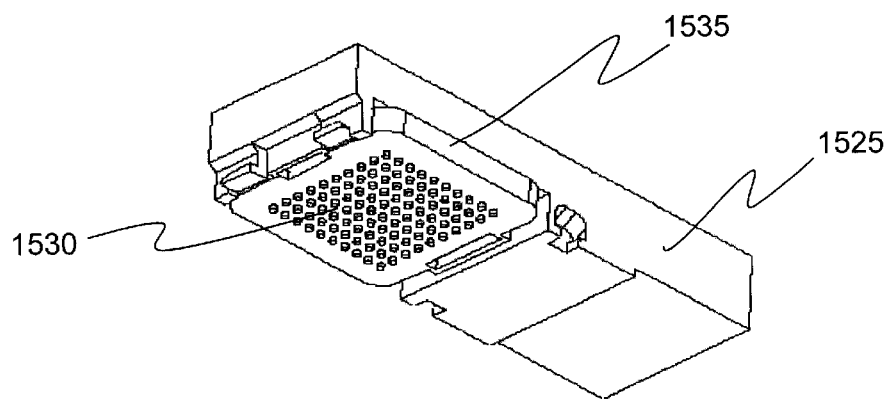
FIG. 15D is bottom perspective view of a transceiver coupled to an electrical connector according to the present invention.

FIG. 15A shows exemplary electrical contact footprints 1505 on a host PWA 1500 coupled with chassis 1510. FIG. 15B shows an electrical connector 1520 mounted on an electrical contact footprint 1505 of host PWA 1500. Electrical connector 1520 provides electrical contacts 1515 for aligning with the transceiver electrical contacts (not shown). FIG. 15C shows a transceiver 1525 coupled with electrical connector 1520 mounted on host PWA 1500. FIG. 15D shows a bottom perspective view of transceiver 1525 coupled with mating electrical connector 1530. Electrical contacts 1535 on mating electrical connector 1530 provide electrical contact with electrical connector 1520 and host PWA 1500. Mating electrical connector 1530 is designed to mate with electrical connector 1520. Together, electrical connector 1520 and mating electrical connector 1530 comprise a mateable electrical connector.

Figure 16A:
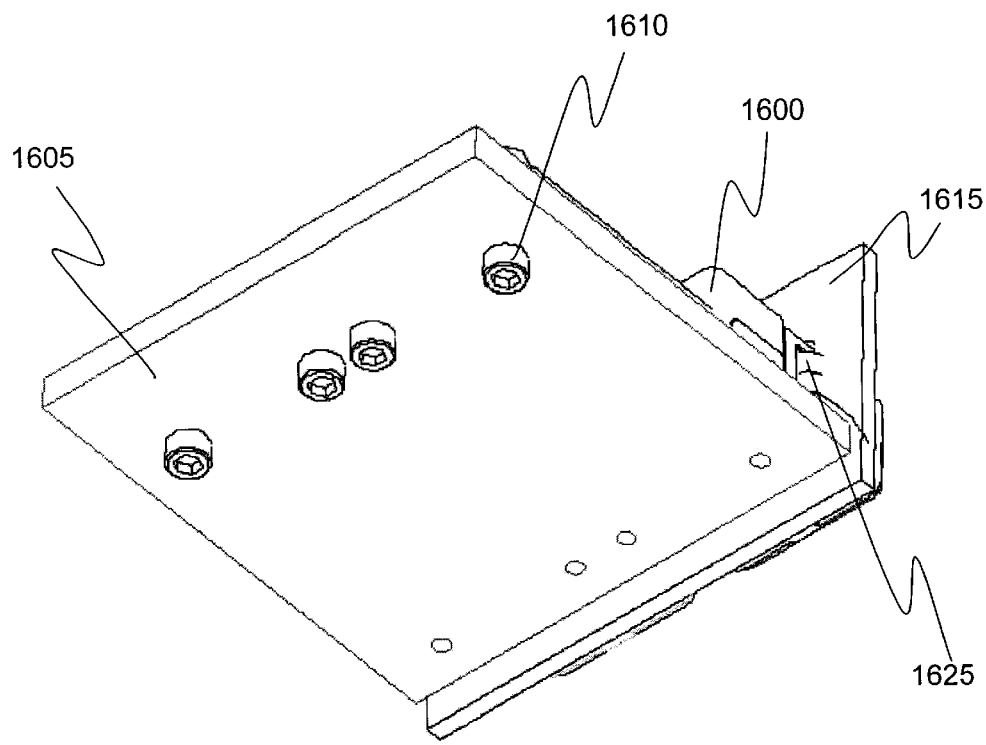
FIG. 16A is a bottom perspective view of a host PWA with a transceiver mounted thereon according to the present invention.
Figure 16B:
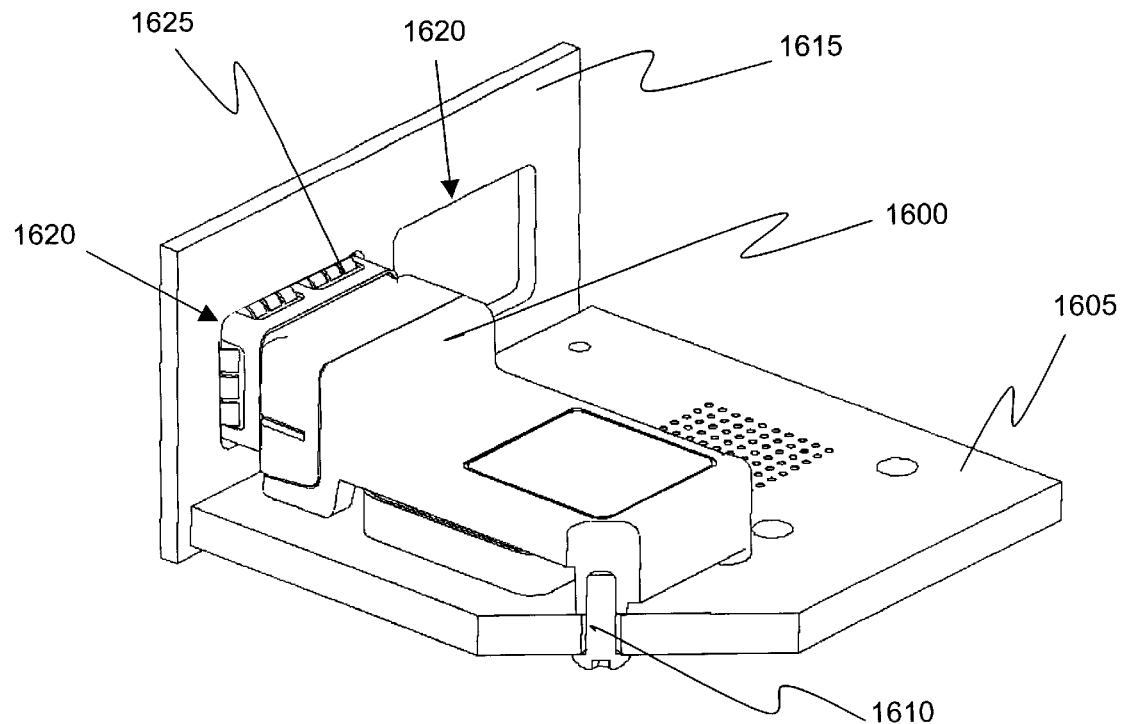
FIG. 16B is a top perspective view of a host PWA with a transceiver mounted thereon according to the present invention.

FIGS. 16A and 16B show transceiver 1600 mounted on host PWA 1605. Transceiver 1600 is secured to host PWA 1605 with screws 1610. Screws 1610 are shown as allen-head screws, but may be any suitable screw or any other suitable securing means for securing transceiver 1600 to host PWA 1605. Other possible suitable securing means include, but are not limited to, latches, pins and clamps. Screws 1610 interact with mounting sockets or threaded regions, or other appropriate securing regions, of transceiver 1600 to secure transceiver 1600 to host PWA 1605. Transceiver 1600 also contacts chassis 1615 at chassis opening 1620 with EMI fingers 1625. EMI fingers 1625 reduce the emission of electromagnetic interference from chassis opening 1620.

The structures and techniques described herein for mating and de-mating transceivers to host PWA's are part of the present invention whether or not they include an adapter substrate.

The present invention includes embodiments in which the transceiver extends though the chassis as well as embodiments in which the transceiver does not extend through the chassis. An adapter of the present invention may be configured to allow a transceiver to be positioned at various locations on the host PWA. Preferably the features mounted on the host PWA are configured such that EMI emission through the chassis is limited. The attachment or connection means discussed throughout the present application allow a transceiver to be coupled with a host PWA with little or no mechanical stress. Known transceiver/PWA configurations generally do not prefer placement of the transceiver away from the chassis wall due to increased EMI emission. In addition, known transceiver/PWA configurations generally encounter mechanical stress if the transceiver is placed proximal to or very near the chassis opening and coupled with a host PWA not specifically manufactured to mate with the transceiver. In such known configurations, the inflexibility of transceiver placement and configuration increases mechanical stress. The present invention alleviates these problems by providing alternative mounting pin arrangements to enable a transceiver to mate with a host PWA not specifically manufactured to mate with the transceiver without increasing mechanical stress.

The electrical contacts on the host PWA, transceiver, adapter, substrate and/or electrical connector may be any suitable contacts, such as pin type, shown for example in FIG. 6B, or L leads, shown for example in FIG. 9B. The contacts may be present in any configuration or number. Exemplary contact configurations are shown in FIGS. 6A and 6B, in which 10×10, 8×10, 9×9 and 6×12 MEG grid array connectors are shown.

The adapter plates of the present invention may have a uni-body construction, i.e. formed from a single sheet of metal by known metal stamping and metal working techniques. In embodiments, the adapter plates may be constructed from steel, copper or metal alloys that have good electrical conductivity. The adapter plates may be made into a completed unit by folding a single sheet, formed, for example, by etching, machining or stamping, and bending the metal to form any associated tabs.

Although one preferred way for forming the adapter plates of the present invention is described above, the adapter plates of the present invention may be made in a variety of ways such as die cast assemblies of parts, or as a separate collection of parts serving the required function.

Preferred materials for making substrates of the present invention are materials providing electrically conductive circuit traces and vias for conductivity through inner layers. Substrates may be fabricated from standard circuit board (PWB) materials such as ceramics, multi-layer ceramics, elastomers, fiber-glass, duroids, and other low-loss materials for RF application. The various tabs of the adapter plates or substrates may be formed by stamping or chemically etching and then bending the tabs using known metal working techniques. Alternatively, the adapter plates may be constructed by other means, such as die casting, using suitable metals, such as zinc, or utilizing separate parts.

Although the present invention has been fully described in conjunction with the preferred embodiment thereof with reference to the accompanying drawings, it is to be understood that various changes and modifications may be apparent to those skilled in the art. Such changes and modifications are to be understood as included within the scope of the invention defined by the appended claims, unless departing therefrom.

What is claimed is:

1. A transceiver adapter comprising: a substrate, including electrical contacts on a first side thereof for electrically contacting a transceiver, and electrical contacts on a second side thereof for electrically contacting a printed wire assembly, wherein said electrical contacts on said first side of said substrate are arranged in a first footprint and said electrical contacts on said second side of said substrate are arranged in a second footprint that is different from said first footprint, wherein said electrical contacts on said first side of said substrate are a different type of electrical contact from said electrical contacts on said second side of said substrate and wherein said electrical contacts on said first side or said second side of said substrate comprise L leads or a ball grid array.

2. The transceiver adapter of claim 1, wherein said electrical contacts on said first side of said substrate comprise L leads.

3. The transceiver adapter of claim 2, wherein said electrical contacts on said second side of said substrate comprise a ball grid array.

4. The transceiver adapter of claim 3, wherein said first footprint has a different location than said second footprint.

5. The transceiver adapter of claim 3, wherein said first footprint has a different orientation than said second footprint.

6. The transceiver adapter of claim 3, wherein said transceiver adapter is part of a transceiver adapter assembly, comprising:
    an optoelectronic transceiver; and
    a printed wire assembly.

7. The transceiver adapter of claim 2, wherein said electrical contacts on said second side of said substrate comprise pin-type contacts.

8. The transceiver adapter of claim 7, wherein said first footprint has a different location than said second footprint.

9. The transceiver adapter of claim 7, wherein said first footprint has a different orientation than said second footprint.

10. The transceiver adapter of claim 7, wherein said transceiver adapter is part of a transceiver adapter assembly, comprising:
    an optoelectronic transceiver; and
    a printed wire assembly.

11. The transceiver adapter of claim 1, wherein said first footprint is square and said second footprint is rectangular.

12. The transceiver adapter of claim 1, wherein said first footprint is rectangular and said second footprint is square.

13. The transceiver adapter of claim 1, wherein said first footprint is square and said second footprint comprises two parallel sets of said electrical contacts.

14. The transceiver adapter of claim 1, wherein said first footprint comprises two parallel sets of said electrical contacts and said second footprint is square.

15. The transceiver adapter of claim 1, wherein said first footprint is rectangular and said second footprint comprises two parallel sets of said electrical contacts.

16. The transceiver adapter of claim 1, wherein said first footprint comprises two parallel sets said electrical contacts and said second footprint is square.

17. The transceiver adapter of claim 1, wherein said electrical contacts on said second side of said substrate comprise L leads.

18. The transceiver adapter of claim 7, wherein said electrical contacts on said first side of said substrate comprise pin-type contacts and said electrical contacts on said second side of said substrate comprise L leads.

19. The transceiver adapter of claim 18, wherein said first footprint has a different location than said second footprint.

20. The transceiver adapter of claim 18, wherein said first footprint has a different orientation than said second footprint.

21. The transceiver adapter of claim 18, wherein said transceiver adapter is part of a transceiver adapter assembly, comprising:
   an optoelectronic transceiver; and
   a printed wire assembly.

22. The transceiver adapter of claim 1, wherein said electrical contacts on said second side of said substrate comprise a ball grid array.

23. The transceiver adapter of claim 22, wherein said electrical contacts on said first side of said substrate comprise pin-type contacts and said electrical contacts on said second side of said substrate comprise a ball grid array.

24. The transceiver adapter of claim 23, wherein said first footprint has a different location than said second footprint.

25. The transceiver adapter of claim 23, wherein said first footprint has a different orientation than said second footprint.

26. The transceiver adapter of claim 23, wherein said transceiver adapter is part of a transceiver adapter assembly, comprising:
   an optoelectronic transceiver; and
   a printed wire assembly.

27. The transceiver adapter of claim 1, wherein said electrical contacts on said first side of said substrate comprise a ball grid array.

28. The transceiver adapter of claim 27, wherein said electrical contacts on said first side of said substrate comprise a ball grid array and said electrical contacts on said second side of said substrate comprise pin-type contacts.

29. The transceiver adapter of claim 28, wherein said first footprint has a different location than said second footprint.

30. The transceiver adapter of claim 28, wherein said first footprint has a different orientation than said second footprint.

31. The transceiver adapter of claim 28, wherein said transceiver adapter is part of a transceiver adapter assembly, comprising:
   an optoelectronic transceiver; and
   a printed wire assembly.

32. The transceiver adapter of claim 27, wherein said electrical contacts on said first side of said substrate comprise a ball grid array and said electrical contacts on said second side of said substrate comprise L leads.

33. The transceiver adapter of claim 32, wherein said first footprint has a different location than said second footprint.

34. The transceiver adapter of claim 32, wherein said first footprint has a different orientation than said second footprint.

35. The transceiver adapter of claim 32, wherein said transceiver adapter is part of a transceiver adapter assembly, comprising:
   an optoelectronic transceiver; and
   a printed wire assembly.

36. A transceiver adapter, comprising:
   a substrate, including electrical contacts on a first side thereof for electrically contacting a transceiver, and electrical contacts on a second side thereof for electrically contacting a printed wire assembly, wherein said electrical contacts on said first side of said substrate are arranged in a first footprint and said electrical contacts on said second side of said substrate are arranged in a second footprint that is different from said first footprint; and
   an adapter plate for positioning a transceiver with respect to said substrate.

37. The transceiver adapter of claim 36, wherein said adapter plate has a uni-body construction.

38. The transceiver adapter of claim 36, wherein said adapter plate comprises tabs for positioning a transceiver.

39. The transceiver adapter of claim 38, wherein said tabs are configured to interact with corresponding cutout regions of a transceiver.

40. The transceiver adapter of claim 36, wherein said adapter plate comprises mounting pins for mechanically coupling said adapter plate with a printed wire assembly.

41. The transceiver adapter of claim 40, wherein said mounting pins are configured to receive therein a screw for securing said adapter plate to a printed wire assembly.

42. The transceiver adapter of claim 36, wherein said adapter plate comprises at least one region on a bottom surface thereof configured to receive therein a screw for securing said adapter plate to a printed wire assembly.

43. The transceiver adapter of claim 36, further comprising:
   a clip mounted on said adapter plate for securing a transceiver to said adapter plate.

44. The transceiver adapter of claim 43, wherein said clip is a collar clip.

45. The transceiver adapter of claim 36, further comprising:
   an electrical connector mounted on said adapter for electrically coupling leads of a transceiver with the substrate.

46. A transceiver adapter, comprising:
   an adapter plate, including (a) tabs for positioning a transceiver, and (b) mounting pins for coupling said adapter plate with a printed wire assembly; and
   a substrate hole through which a transceiver may be electrically mated with a printed wire assembly;
   a footprint adapting substrate disposed within said substrate hole, wherein said footprint adapting substrate comprises first electrical contacts on a first side of said footprint adapting substrate for electrically contacting a transceiver, and second electrical contacts on a second side of said footprint adapting substrate for electrically contacting a printed wire assembly and wherein said electrical contacts on said first side of said footprint adapting substrate are arranged in a first footprint and said electrical contacts on said second side of said footprint adapting substrate are arranged in a second footprint that is different from said first footprint.

47. The transceiver adapter of claim 46, wherein said footprint adapting substrate comprises electrically conductive circuit traces.

48. The transceiver adapter of claim 40, wherein said footprint adapting substrate is deposited in said substrate hole.

49. The transceiver adapter of claim 46, wherein said first footprint has a different location than said second footprint.

50. The transceiver adapter of claim 46, wherein said first footprint has a different orientation than said second footprint.

* * * * *